US010224171B2

(12) United States Patent
Touya et al.

(10) Patent No.: US 10,224,171 B2
(45) Date of Patent: Mar. 5, 2019

(54) BLANKING DEVICE FOR MULTI CHARGED PARTICLE BEAMS, AND MULTI CHARGED PARTICLE BEAM IRRADIATION APPARATUS

(71) Applicant: NuFlare Technology, Inc., Yokohama-shi (JP)

(72) Inventors: Takanao Touya, Kawasaki (JP); Hiroshi Matsumoto, Yokohama (JP); Munehiro Ogasawara, Hiratsuka (JP); Hirofumi Morita, Setagaya-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/591,767

(22) Filed: May 10, 2017

(65) Prior Publication Data
US 2017/0345612 A1    Nov. 30, 2017

(30) Foreign Application Priority Data
May 31, 2016    (JP) .................................. 2016-108726

(51) Int. Cl.
    *H01J 37/04*    (2006.01)
    *H01J 37/317*    (2006.01)
(52) U.S. Cl.
    CPC ........ *H01J 37/045* (2013.01); *H01J 37/3177* (2013.01); *H01J 2237/0435* (2013.01); *H01J 2237/31774* (2013.01)
(58) Field of Classification Search
    USPC .................................................... 250/491.1
    See application file for complete search history.

(56) References Cited

U.S. PATENT DOCUMENTS

| 5,214,289 A * | 5/1993 | Betsui | H01J 37/045 |
| | | | 250/396 R |
| 7,368,738 B2 * | 5/2008 | Platzgummer | B82Y 10/00 |
| | | | 250/398 |

(Continued)

FOREIGN PATENT DOCUMENTS

| JP | 2005-123264 | 5/2005 |
| JP | 2005-328047 A | 11/2005 |
| JP | 2011-171713 A | 9/2011 |

OTHER PUBLICATIONS

Combined Office Action and Search Report dated May 9, 2018 in Taiwanese Patent Application No. 106114427 with English translation, citing documents AA and AB therein, 11 pages.

(Continued)

*Primary Examiner* — Phillip A Johnston
(74) *Attorney, Agent, or Firm* — Oblon, McClelland, Maier & Neustadt, L.L.P.

(57) ABSTRACT

A blanking device for multi charged particle beams includes a first substrate, in which plural first openings are formed in an array, to form multi-beams, a second substrate in which plural second openings are formed in an array, where a corresponding beam of the multi-beams passes through each of the plural second openings, plural control electrodes, which are on the second substrate and each of which is close to a corresponding one of the plural second openings and arranged not to be directly exposed to other second opening adjacent to the corresponding one of the plural second openings, to be switchably applied with first and second potentials, plural counter electrodes, each of which is facing a corresponding one of the plural control electrodes, to be applied with the second potential, and a shield film provided between the first substrate and the plural control electrodes.

10 Claims, 25 Drawing Sheets

(56) References Cited

U.S. PATENT DOCUMENTS

| | | | |
|---|---|---|---|
| 8,546,767 B2* | 10/2013 | Platzgummer | B82Y 10/00 250/396 R |
| 2010/0288938 A1 | 11/2010 | Platzgummer | |
| 2011/0204253 A1 | 8/2011 | Platzgummer et al. | |
| 2013/0026386 A1* | 1/2013 | Utsumi | C25D 5/02 250/396 R |

OTHER PUBLICATIONS

Office Action dated May 15, 2018 in Korean Patent Application No. 10-2017-0065290 with English translation, citing documents AO and AP therein, 11 pages.

* cited by examiner

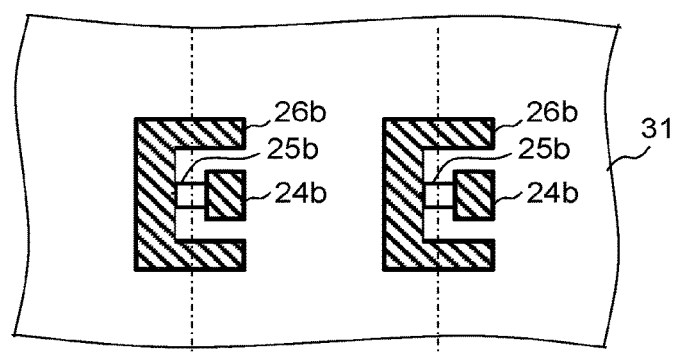
FIG.7A
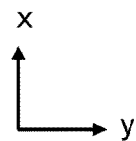
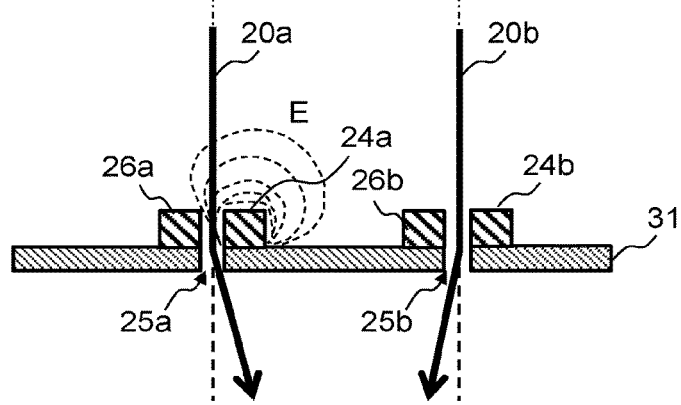
FIG.7B

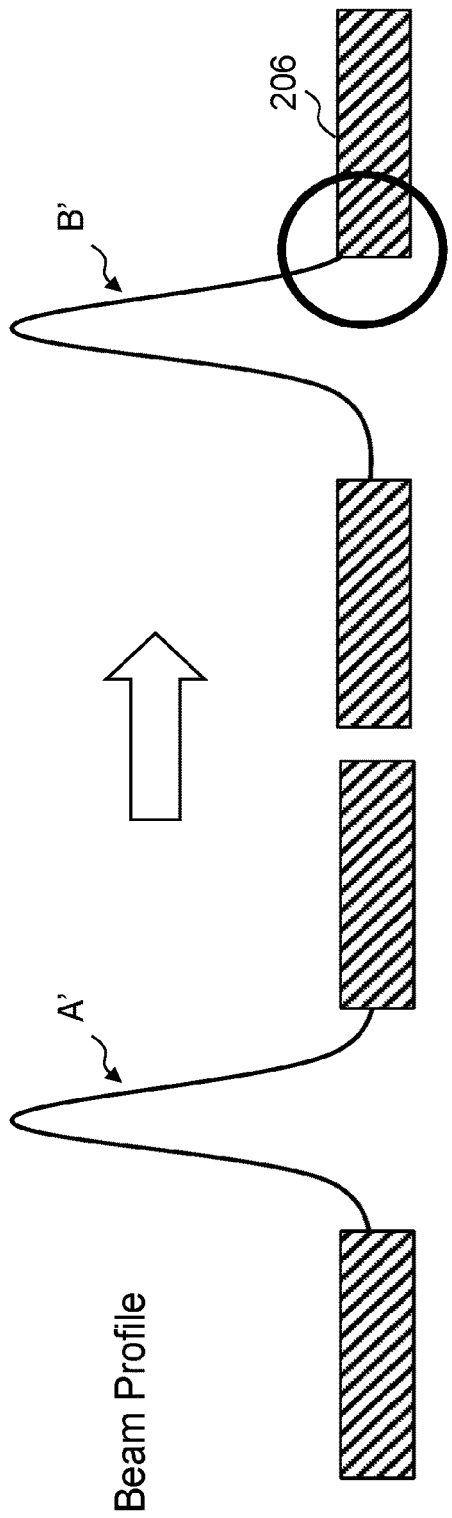

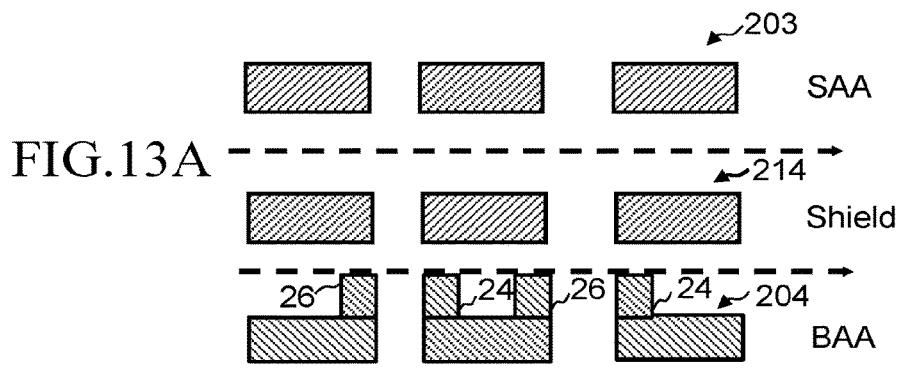
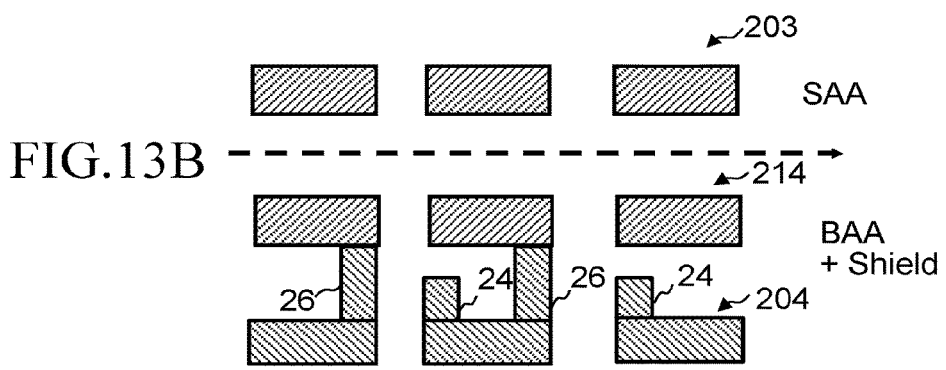
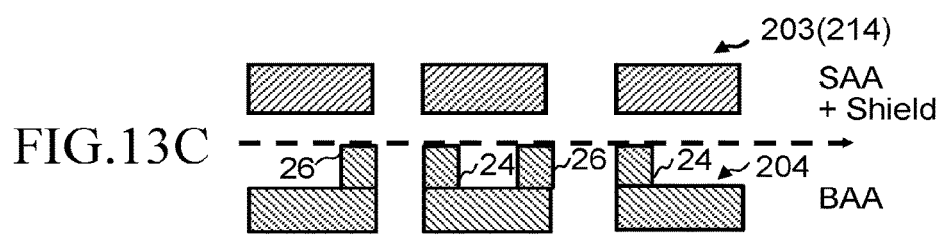
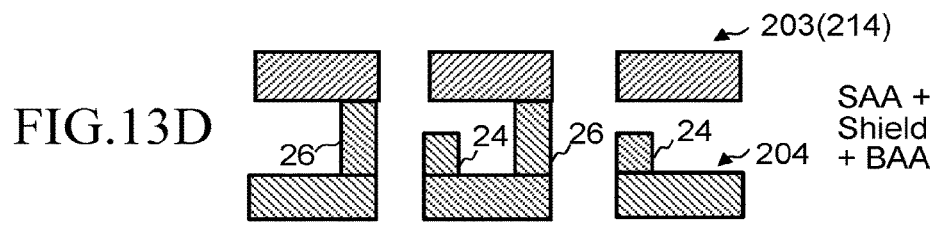

BLANKING DEVICE FOR MULTI CHARGED PARTICLE BEAMS, AND MULTI CHARGED PARTICLE BEAM IRRADIATION APPARATUS

CROSS-REFERENCE TO RELATED APPLICATION

This application is based upon and claims the benefit of priority from the prior Japanese Patent Application No. 2016-108726 filed on May 31, 2016 in Japan, the entire contents of which are incorporated herein by reference.

BACKGROUND OF THE INVENTION

Field of the Invention

Embodiments of the present invention relate generally to a blanking device for multi charged particle beams, and a multi charged particle beam irradiation apparatus, and more specifically, to a blanking device mounted in a multi-beam writing apparatus, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique, which intrinsically has excellent resolution, is used for writing or "drawing" with electron beams on a wafer, etc.

As a known example of employing the electron beam writing technique, there is a writing apparatus using multi-beams. Since it is possible for multi-beam writing to irradiate multiple beams at a time, the writing throughput can be greatly increased in comparison with single beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system, and deflects the beam by a deflector to irradiate a desired position on a target object or "sample".

In multi-beam writing, the dose of each beam is individually controlled based on an irradiation time. For highly accurately controlling such a dose of each beam, it is necessary to perform high speed blanking control to provide an ON or OFF condition of each beam. In a writing apparatus employing a multi-beam system, there is mounted a blanking device where passage holes for multi-beams are formed, and a pair of blanking electrodes (blanker) and a blanking control circuit (LSI circuit) for each of the multi-beams are arranged at the circumference of each of the passage holes. Using the MEMS (Micro Electro Mechanical Systems) technique, a passage hole, a pair of blanking electrodes (deflector), etc. are formed on a silicon (Si) substrate in the blanking device. There has been a problem in that since each beam passing through the blanking device is affected by electric field leakage from a blanking electrode, etc. of an adjacent beam, the beam trajectory bends, and therefore, a beam irradiation position on the target surface deviates. This problem is not limited to the writing apparatus, and may similarly occur with respect to an apparatus, such as an inspection apparatus, which irradiates desired positions with charged particle multi-beams.

There is disclosed a technique that inhibits charging of an exposed insulating film other than wiring and electrodes, and reduces crosstalk between adjacent deflectors by making a grounded shield electrode substrate face to a blanking device where control circuit wiring connected to a blanking electrode is exposed on a substrate (e.g., refer to Japanese Patent Application Laid-open (JP-A) No. 2005-123264). However, this structure is not sufficient to inhibit deviation of each beam trajectory due to influence of electric field leakage from a blanking electrode, etc. of an adjacent beam, thereby deviating beam irradiation positions on the target object surface.

BRIEF SUMMARY OF THE INVENTION

According to one aspect of the present invention, a blanking device for multi charged particle beams includes a first substrate, in which a plurality of first openings are formed in an array, configured to form multi-beams by making a region including a whole of the plurality of first openings irradiated by a charged particle beam, and making portions of the charged particle beam individually pass through a corresponding one of the plurality of first openings; a second substrate in which a plurality of second openings are formed in an array, where a corresponding beam of the multi-beams passes through each of the plurality of second openings; a plurality of control electrodes, which are on the second substrate and each of which is arranged close to a corresponding one of the plurality of second openings and arranged so as not to be directly exposed to other second opening adjacent to the corresponding one of the plurality of second openings, configured to be switchably applied with a first potential and a second potential; a plurality of counter electrodes, which are on the second substrate and each of which is arranged to be facing a corresponding one of the plurality of control electrodes across a corresponding one of the plurality of second openings, configured to be applied with the second potential; a shield film, provided between the first substrate and the plurality of control electrodes, configured to shield against an electric field; and a plurality of control circuits, arranged in the second substrate, configured to switchably apply the first potential and the second potential to a corresponding one of the plurality of control electrodes.

According to another aspect of the present invention, a multi charged particle beam irradiation apparatus includes a stage configured to mount a target object thereon and to be continuously movable, an emission source configured to emit a charged particle beam, a blanking device for multi charged particle beams of claim 1, configured to form multi-beams by using the charged particle beam, and provide blanking deflection of a corresponding one of the multi-beams, and a limiting aperture substrate configured to block each beam deflected to be in a beam OFF condition by the blanking device.

BRIEF DESCRIPTION OF THE DRAWINGS

FIGS. 7A and 7B illustrate electric field leakage from an adjacent blanker according to a comparative example 1 to the first embodiment;

FIGS. 8A and 8B show an example of change in a beam profile on the limiting aperture according to the comparative example 1 to the first embodiment;

FIGS. 13A to FIG. 13D are sectional views showing combination examples of structures of a shaping blanking aperture array mechanism according to the first embodiment;

DETAILED DESCRIPTION OF THE INVENTION

First Embodiment

A first embodiment describes a blanking device and a multi-beam irradiation apparatus that can inhibit influence of electric field leakage from blanking electrodes, etc. of an adjacent beam in multi-beam writing.

In the first embodiment, there will be described a structure in which an electron beam is used as an example of a charged particle beam. The charged particle beam is not limited to the electron beam, and other charged particle beam such as an ion beam may also be used. Moreover, although a writing apparatus is described as an example of the multi-beam irradiation apparatus, the first embodiment can also be applied to an apparatus, such as an inspection apparatus, which irradiates desired positions with charged particle multi-beams.

Figure 1:
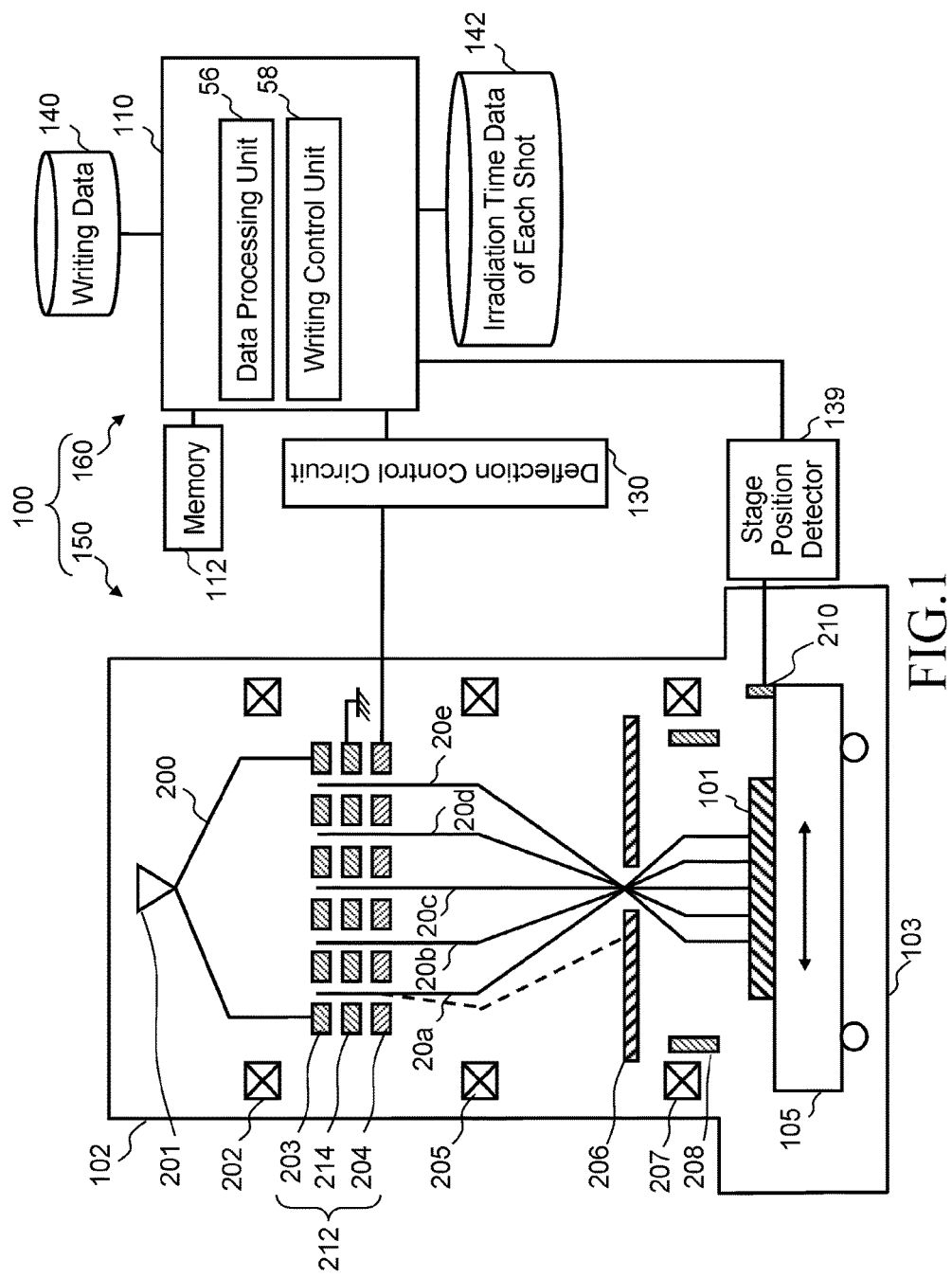
FIG. 1 is a conceptual diagram showing a structure of a writing apparatus according to a first embodiment.

FIG. 1 is a conceptual diagram showing a structure of a writing or "drawing" apparatus according to the first embodiment. As shown in FIG. 1, a writing apparatus 100 includes a writing mechanism 150 and a control circuit 160. The writing apparatus 100 is an example of a multi charged particle beam writing apparatus and an example of a multi charged particle beam irradiation apparatus. The writing mechanism 150 includes an electron optical column 102 and a writing chamber 103. In the electron optical column 102, there are arranged an electron gun 201, an illumination lens 202, a shaping blanking aperture array mechanism 212, a reducing lens 205, a limiting aperture substrate 206, an objective lens 207, and a deflector 208. As the shaping blanking aperture array mechanism 212 (an example of a blanking device), there are arranged a shaping aperture array substrate 203, a shield substrate 214, and a blanking aperture array mechanism 204. In the writing chamber 103, an XY stage 105 is arranged. On the XY stage 105, a target object or "sample" 101 such as a mask serving as a writing substrate is placed when writing (irradiating) is performed. The target object 101 is, for example, an exposure mask used for manufacturing semiconductor devices, or a semiconductor substrate (silicon wafer) for manufacturing semiconductor devices. Moreover, the target object 101 may be, for example, a mask blank on which resist has been applied and nothing has yet been written. A mirror 210 for measuring the position of the XY stage 105 is arranged on the XY stage 105.

The control circuit 160 includes a control computer 110, a memory 112, a deflection control circuit 130, a stage position detector 139, and storage devices 140 and 142 such as magnetic disk drives. The control computer 110, the memory 112, the deflection control circuit 130, the stage position detector 139, and the storage devices 140 and 142 are connected with each other through a bus (not shown). Writing data is input from the outside of the writing apparatus 100 to the storage device 140 (storage unit), and stored therein.

In the control computer 110, there are arranged a data processing unit 56 and a writing control unit 58. Each of " ... units" such as the data processing unit 56 and the writing control unit 58 includes a processing circuitry. As the processing circuitry, for example, an electric circuit, computer, processor, circuit board substrate, quantum circuit, or semiconductor device can be used. Each unit "..." may use a common processing circuitry (same processing circuitry), or different processing circuitries (separate processing circuitries). Information input and output to/from the control computer 110, and information being operated are stored in the memory 112 each time.

FIG. 1 shows structure elements necessary for describing the first embodiment. It should be understood that other structure elements generally necessary for the writing apparatus 100 may also be included therein.

Figure 2:
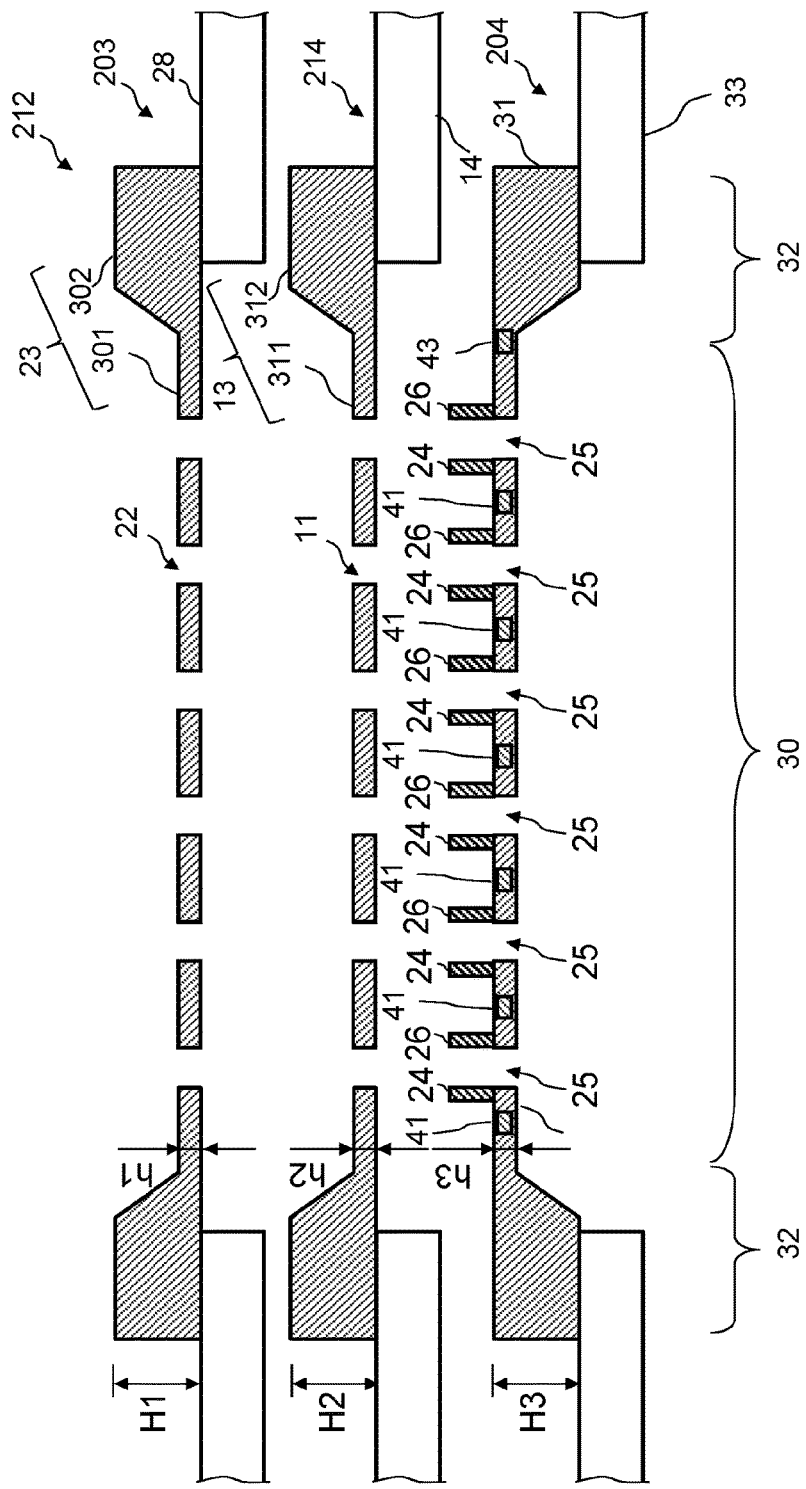
FIG. 2 is a sectional view showing the structure of a shaping blanking aperture array mechanism according to the first embodiment.

FIG. 2 is a sectional view showing the structure of a shaping blanking aperture array mechanism according to the first embodiment. In the shaping blanking aperture array mechanism 212 shown in FIG. 2, the shaping aperture array substrate 203, the shield substrate 214, and the blanking aperture array mechanism 204 are arranged in order from the upper side. With regard to the structure of the shaping aperture array substrate 203, as shown in FIG. 2, a substrate 23 made of silicon, etc. is placed on a support table 28. The central portion of the substrate 23 is ground from the upper surface side, and made into a membrane region 301 having a thin film h1. The circumference surrounding the membrane region 301 is a circumferential region 302 having a thick film H1. The rear surface of the membrane region 301 and the rear surface of the circumferential region 302 are preferably formed to be flush in height with each other, or substantially flush in height with each other. At the back side of the circumferential region 302, the substrate 23 is supported on the support table 28. The central portion of the support table 28 is open, and the membrane region 301 is located in the opening portion of the support table 28.

Figure 3A:
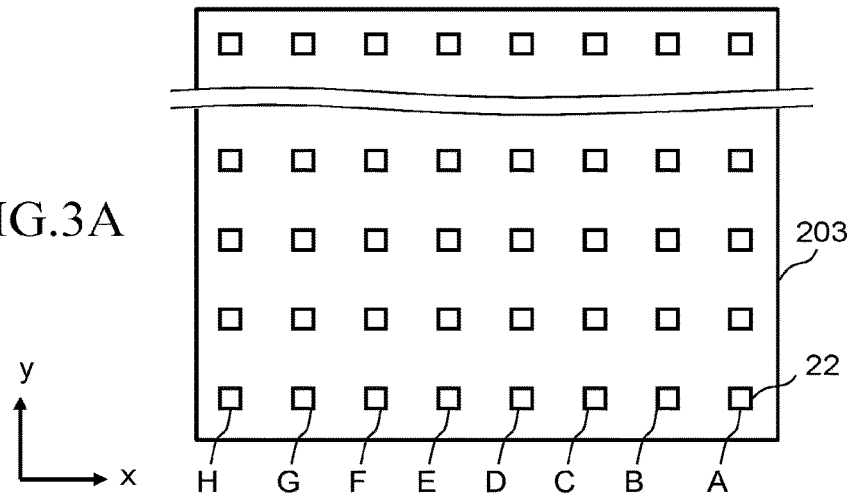
FIGS. 3A and 3B are conceptual diagrams each showing a structure of a shaping aperture array substrate according to the first embodiment.
Figure 3B:
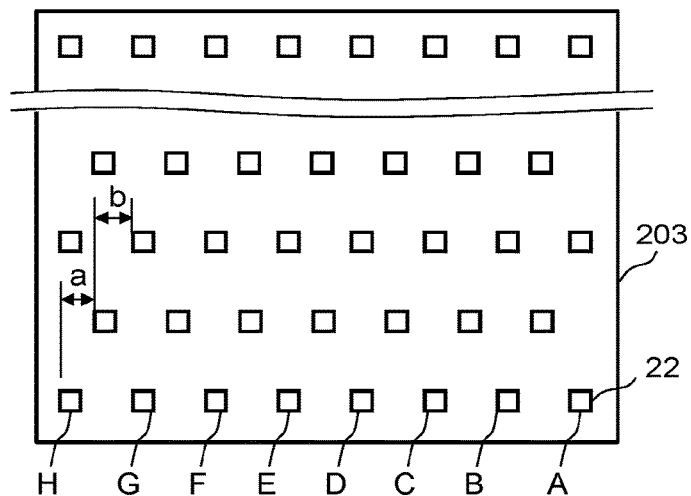

FIGS. 3A and 3B are conceptual diagrams each showing a structure of a shaping aperture array substrate according to the first embodiment. As shown in FIG. 3A, holes (openings) 22 of m rows long (y direction) and n columns wide (x direction) (m≥2, n≥2) are formed, like a matrix, at a predetermined arrangement pitch in the membrane region 301 of the shaping aperture array substrate 203. In other words, there are a plurality of holes 22 (first opening) are formed in an array in the substrate 23 (first substrate). In FIG. 3A, for example, holes 22 of 512 (rows)×8 (columns) are formed. Each of the holes 22 is a quadrangle of the same dimension and shape. Alternatively, each of the holes 22 can be a circle of the same outer diameter. Here, there is shown an example where each of the rows arrayed in the y direction has eight holes 22 from A to H in the x direction. Multi-beams 20 are formed by letting portions of an electron beam 200 individually pass through a corresponding one of a plurality of holes 22. The case in which the holes 22 of a plurality of rows and columns are arranged in both the x and the y directions is shown here, but the arrangement is not limited thereto. For example, it is also acceptable that a plurality of holes 22 are arranged in only one row (x direction) or in only one column (y direction). That is, in the case of the only one row, a plurality of holes 22 are arranged as a plurality of columns, and in the case of the only one column, a plurality of holes 22 are arranged as a plurality of rows. The arrangement of the holes 22 is not limited to the grid-like arrangement in the length and width directions as shown in FIG. 3A. For example, as shown in FIG. 3B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

With regard to the shield substrate 214, as shown in FIG. 2, a substrate 13 made of silicon, etc. is placed on a support table 14. The central portion of the substrate 13 is ground from the upper surface side, and made into a membrane region 311 having a thin film h2. The circumference surrounding the membrane region 311 is a circumferential region 312 having a thick film H2. The rear surface of the membrane region 311 and the rear surface of the circumferential region 312 are preferably formed to be flush in height with each other, or substantially flush in height with each other. At the back side of the circumferential region 312, the substrate 13 is supported on the support table 14. The central portion of the support table 14 is open, and the membrane region 311 is located at the opening portion of the support table 14.

In the membrane region 311 of the shield substrate 214, there are formed a plurality of openings 11 each of which is positioned corresponding to at least each hole 22 of the shaping aperture array substrate 203 shown in FIG. 3A (or 3B) so as to enable a corresponding one of multi-beams to pass therethrough. In the membrane region 311 of the substrate 13, a shield film of conductive material has been applied to exposed surfaces of the substrate 13 (third substrate), such as the upper surface, the rear surface, and the inner surface of the opening 11. Preferably, the exposed surface of the circumferential region 312 is coated with the shield film. Note that the shield film is grounded (earthed).

Figure 4:
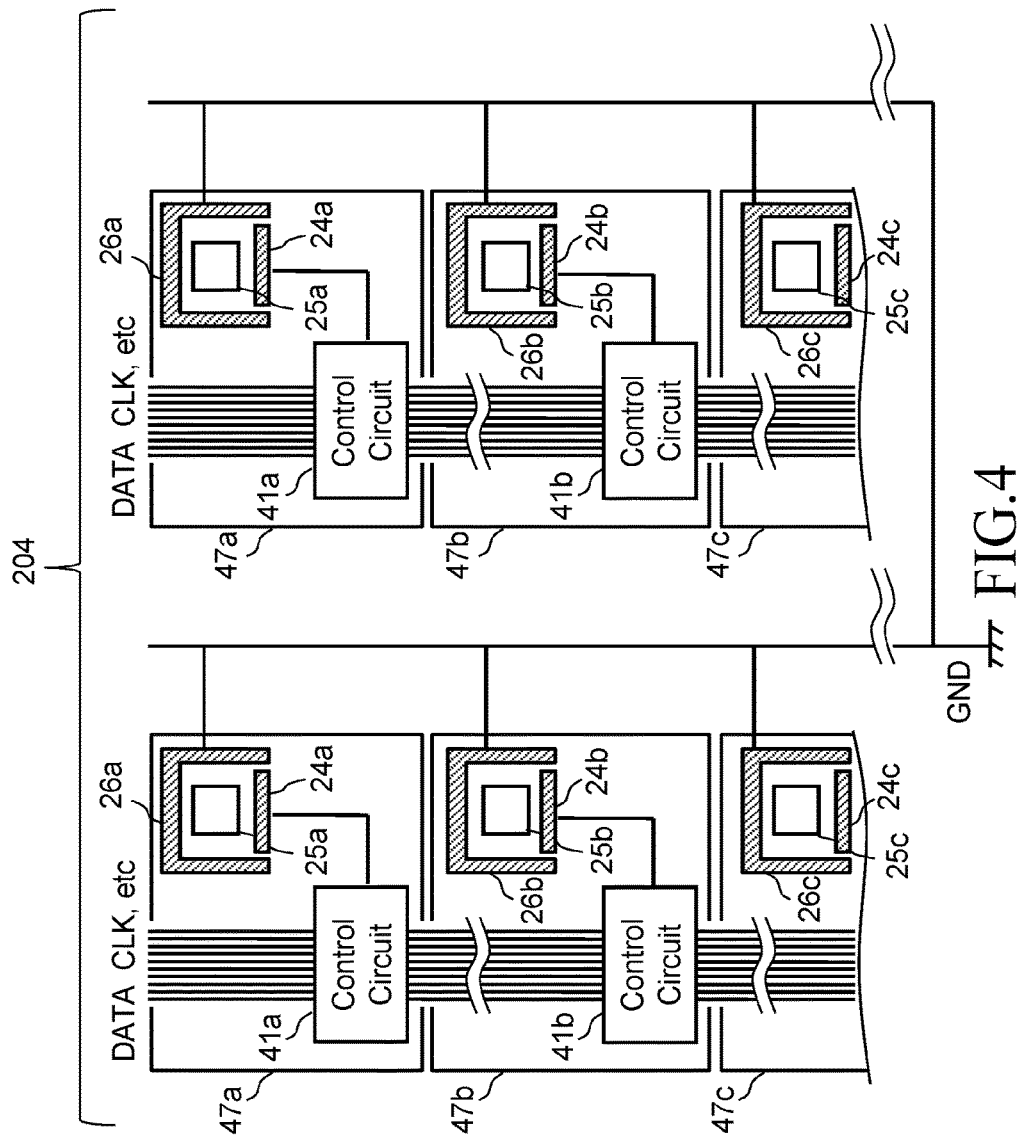
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. Between FIGS. 2 and 4, the positional relation among an electrode 24, an electrode 26, and a control circuit 41 is not in accordance with each other. With regard to the structure of the blanking aperture array mechanism 204, as shown in FIG. 2, a semiconductor substrate 31 made of silicon, etc. is placed on a support table 33. The central portion of the substrate 31 is ground from the back side, and made into a membrane region 30 (first region) having a thin film h3. The circumference surrounding the membrane region 30 is a circumferential region 32 (second region) having a thick film H3. The upper surface of the membrane region 30 and the upper surface of the circumferential region 32 are formed to be flush in height with each other, or substantially flush in height with each other. At the back side of the circumferential region 32, the substrate 31 is supported on the support table 33. The central portion of the support table 33 is open, and the membrane region 30 is located at the opening portion of the support table 33.

In the membrane region 30 of the blanking aperture array mechanism 204, there are formed passage holes 25, through each of which a corresponding one of multi-beams passes, at positions each corresponding to each hole 22 of the shaping aperture array substrate 203 shown in FIG. 3A (or 3B). In other words, in the substrate 31 (second substrate), a plurality of penetrating passage holes 25 (second opening) through each of which a corresponding one of the multi-beams 20 passes are formed in a two-dimensional array of m rows long (y direction) and n columns wide (x direction) (m≥2, n≥2). In the membrane region 30 shown in FIGS. 2 and 4, a plurality of pairs of electrodes, each being a pair (blanker: blanking deflector) of a control electrode 24 and a counter electrode 26 for blanking deflection, are arranged close to respective passage holes 25 such that the control electrode 24 and the counter electrode 26 are at the opposite sides of a corresponding one of a plurality of passage holes 25. In other words, each of a plurality of control electrodes 24 is arranged close to a corresponding one of a plurality of passage holes 25 in the substrate 31. Each of a plurality of counter electrodes 26 is arranged to be facing a corresponding one of a plurality of control electrodes 24 across a corresponding one of a plurality of passage holes 25 in the substrate 31.

Moreover, close to each passage hole 25 in the substrate 31 of the membrane region 30, there is provided the control circuit 41 (logic circuit) for applying a deflection voltage to, for example, the electrode 24 for each passage hole 25. n-bit (e.g., 1 to 10 bits) parallel lines for control signals are connected to each control circuit 41. In addition to the n-bit parallel lines, wiring lines for a power source, a control clock, etc. are connected to each control circuit 41. A part of the parallel lines may be used as the power source wiring line. An individual blanking mechanism 47 composed of the control electrode 24, the counter electrode 26, and the control circuit 41 is configured for each beam of the multi-beams. On the circumferential region 32 having a thick film, a pad, etc. (not shown) for transmitting a control signal to each control circuit 41 is arranged.

Figure 5:
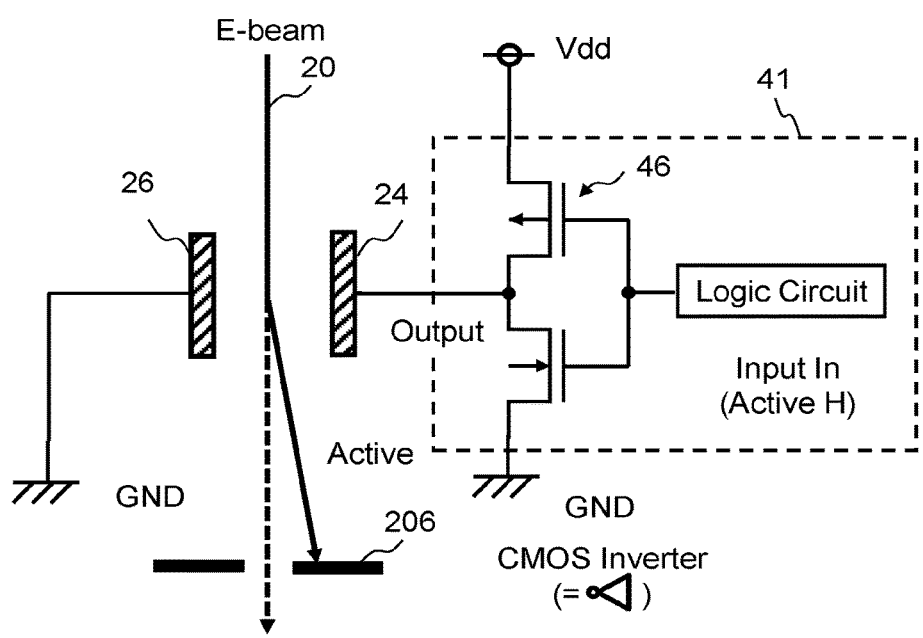
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential (GND: second electric potential). A plurality of control circuits 41 controlled by the deflection control circuit 130 are arranged in the substrate 31. Each of the control circuits 41 applies a positive electric potential (first potential) and a ground electric potential (second potential) in a switchable manner to a corresponding one of a plurality of control electrodes 24.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state (active state) where an H electric potential is applied to the input (IN) of the CMOS inverter circuit, the output (OUT) of the CMOS inverter circuit becomes a positive potential (Vdd), and therefore, controlling is performed to have a beam OFF condition by deflecting, for example, a corresponding beam 20a in the multi-beams 20 by an electric field due to a potential difference from the ground potential of the counter electrode 26, and blocking the beam using the limiting aperture substrate 206. On the other hand, in a state where an L electric potential is applied to the input (IN) of the CMOS inverter circuit, the output (OUT) of the CMOS inverter circuit becomes a ground potential, and therefore, since there is no potential difference from the ground potential of the counter electrode 26, the corresponding beam 20a is not deflected, and controlling is performed to have a beam ON condition by letting the beam pass through the limiting aperture substrate 206.

Each of the multi-beams beam 20 passing through a corresponding passage hole is independently deflected by a voltage applied to the control electrode 24 and the counter electrode 26 being a pair. Blanking control is performed by this deflection. Specifically, a pair of the control electrode 24 and the counter electrode 26 individually provides blanking deflection of a corresponding beam of the multi-beams by an electric potential switched by the CMOS inverter circuit which serves as a corresponding switching circuit. Thus, each of a plurality of blankers performs blanking deflection for a corresponding beam in the multi-beams having passed through a plurality of holes 22 (openings) of the shaping aperture array substrate 203.

Preferably, in FIG. 2, each of the shaping aperture array substrate 203, the shield substrate 214, and the blanking aperture array mechanism 204 is arranged on a stage (not shown) movable, for example, in the x and y directions and a rotation direction so that position alignment with an opening through which a corresponding beam passes may be mutually performed.

Alternatively, regarding one of the shaping aperture array substrate 203, the shield substrate 214, and the blanking aperture array mechanism 204 as a reference, preferably, each of them is arranged on a stage (not shown) movable, for example, in the x and y directions and a rotation direction so that the other two can perform alignment with the position of the reference one.

Figure 6:
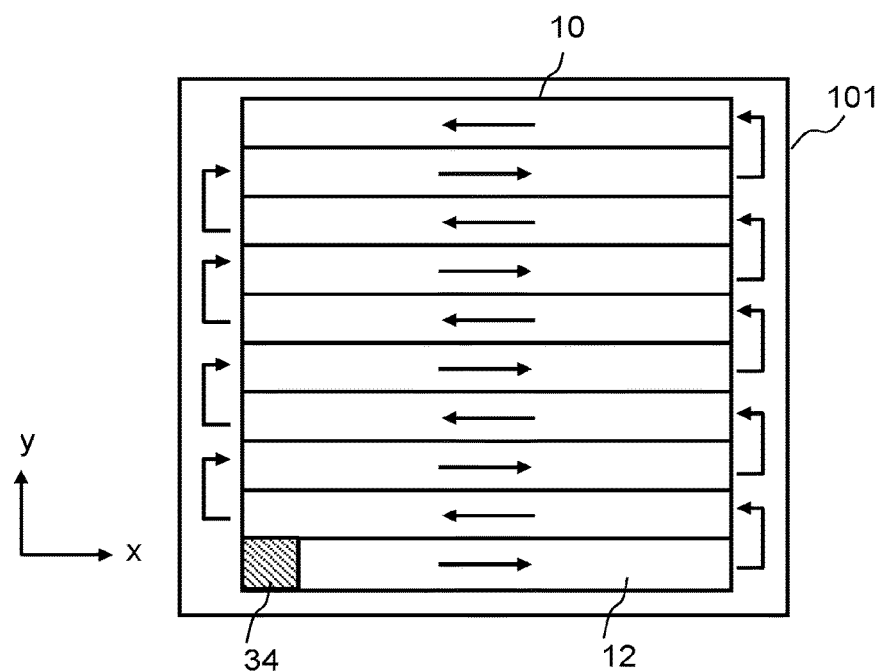
FIG. 6 is a conceptual diagram explaining an example of a writing operation according to the first embodiment.

FIG. 6 is a conceptual diagram explaining an example of a writing operation according to the first embodiment. Writing data stored in the storage device 140 is converted into irradiation time data for each shot by the data processing unit 56. The writing mechanism 150 operates under the control of the writing control unit 58 as described below. As shown in FIG. 6, a writing region 10 of the target object 101 is virtually divided into a plurality of strip-shaped stripe regions 12 by a predetermined width in the y direction, for example. First, the XY stage 105 is moved to make an adjustment such that an irradiation region 34 which can be irradiated with one shot of the multi-beams 20 is located at the left end of the first stripe region 12 or at a position further left than the left end, and then writing is started. When writing the first stripe region 12, the XY stage 105 is moved, for example, in the −x direction, so that the writing advances relatively in the x direction. For example, the XY stage 105 is moved continuously at a constant speed. After writing the first stripe region 12, the stage position is moved in the −y direction to make an adjustment such that the irradiation region 34 is located relatively in the y direction at the right end of the second stripe region 12 or at a position further right than the right end. Then, by moving the XY stage 105 in the x direction, for example, writing similarly advances in the −x direction. That is, writing is performed while alternately changing the direction, such as performing writing in the x direction in the third stripe region 12, and in the −x direction in the fourth stripe region 12, thereby reducing the writing time. However, the writing operation is not limited to writing while alternately changing the direction. It is also preferable to perform writing in the same direction when writing each stripe region 12. A plurality of shot patterns up to as many as the number of the holes 22 are formed at a time by one shot of multi-beams having been formed by passing through the holes 22 in the shaping aperture array substrate 203.

The stripe region 12 is divided into a plurality of mesh regions by the size of each beam of the multi-beams, for example. Each mesh region serves as a writing pixel (unit irradiation region, or writing position). The size of the writing pixel is not limited to the beam size, and may be an arbitrary size regardless of the beam size. For example, it may be 1/n (n being an integer of 1 or more) of the beam size. FIG. 6 shows the case where the writing region of the target object 101 is divided into a plurality of stripe regions 12 by the width size being substantially the same as the size of the irradiation region 34 (writing field). The width of the stripe region 12 is not limited to this. Preferably, the width of the stripe region 12 is n times (n being an integer of 1 or more) the size of the irradiation region 34. In the irradiation region 34, the pitch between a plurality of pixels which can be irradiated by one shot of the multi-beams 20 is the pitch between beams of the multi-beams. Each of pixels is sequentially written, in a square region (grid) surrounded by four adjacent pixels spaced at the beam pitch and including one of the four pixels, by one or plural different beams. Concrete operation of the writing mechanism 150 at each shot time is described below.

The electron beam 200 emitted from the electron gun 201 (emission source) almost perpendicularly (e.g., vertically) illuminates the entire shaping aperture array substrate 203 with the illumination lens 202. The region including all the plurality of holes is irradiated with the electron beam 200. For example, a plurality of quadrangular electron beams 20a to 20e are formed by letting portions of the electron beam 200 irradiating the plurality of holes 22 individually pass through a corresponding one of the holes 22 in the shaping aperture array substrate 203. After each of the electron beams 20a to 20e in the multi-beams 20 has passed through a corresponding one of a plurality of openings 11 in the shield substrate 214, it passes through the inside of a corresponding blanker (pair of the control electrode 24 and the counter electrode 26) (first deflector: individual blanking mechanism 47) of the blanking aperture array mechanism 204. In accordance with irradiation time data, the blanker provides blanking control by switchingly applying an electric potential from the control circuit 41 controlled by the deflection control circuit 130 so that at least a corresponding beam of the multi-beams 20 which individually passes through the blanker may be in an ON condition during a defined writing time (irradiation time).

The multi-beams 20a to 20e having passed through the blanking aperture array mechanism 204 are reduced by the reducing lens 205, and go toward the hole in the center of the limiting aperture substrate 206. At this stage, an electron beam 20' which was deflected by the blanker of the blanking aperture array mechanism 204 deviates (shifts) from the hole in the center of the limiting aperture substrate 206 (blanking aperture member) and is blocked by the limiting aperture substrate 206. On the other hand, the electron beams 20a to 20e which were not deflected by the blanker of the blanking aperture array mechanism 204 pass through the hole in the center of the limiting aperture substrate 206 as shown in FIG. 1. Thus, the limiting aperture substrate 206 blocks each beam which was deflected to be in an OFF condition by the individual blanking mechanism 47. A beam for one shot is formed by a beam made during from beam ON to beam OFF and having passed through the limiting aperture substrate 206. Thus, the shaping blanking aperture array mechanism 212 forms the multi-beams 20 by using the electron beam 200 and provides blanking deflection of a corresponding beam in the multi-beams 20. The limiting aperture substrate 206 blocks each beam deflected to be in an OFF condition by the shaping blanking aperture array mechanism 212.

The multi-beams 20 having passed through the limiting aperture substrate 206 are focused by the objective lens 207 so as to be a pattern image with a desired reduction ratio. Then, respective beams (the whole of the multi-beams 20) having passed through the limiting aperture substrate 206 are collectively deflected in the same direction by the deflector 208 in order to irradiate respective beam irradiation positions on the target object 101. For example, while the XY stage 105 is continuously moving, the deflector 208 performs controlling so that the irradiation positions of the beams may follow (track) the movement of the XY stage 105. Ideally, the multi-beams 20 irradiating at a time are aligned with a pitch obtained by multiplying the arrangement pitch of a plurality of holes 22 in the shaping aperture array substrate 203 by a desired reduction ratio described above.

FIGS. 7A and 7B illustrate electric field leakage from an adjacent blanker according to a comparative example 1 to the first embodiment. FIG. 7A shows a top view of two beam passage holes 25a and 25b arranged in the y direction, a pair of a control electrode 24a and a counter electrode 26a across a passage hole 25a, and a pair of a control electrode 24b and a counter electrode 26b across a passage hole 25b, for example. FIG. 7B shows a sectional view at the position of the passage hole 25 in FIG. 7A. In FIG. 7B, a positive electric potential for blanking to make a beam OFF condition is applied to the left side control electrode 24a, and a ground potential for a beam ON condition is applied to the right side control electrode 24b. Ground potential has been applied to both the counter electrodes 26a and 26b. In such a case, as shown in FIG. 7B, an leaked electric field E is generated from the left side control electrode 24a. In FIG. 7B, although the spread of the leaked electric field E is shown only halfway, due to this leaked electric field E, an electron beam 20b passing between the control electrodes 24b and the counter electrodes 26b adjacent on the right side is attracted to a positive potential, and the trajectory of the electron beam 20b is bent. In FIG. 7B, although the beam is bent while passing between the control electrode 24b and the counter electrode 26b for the sake of convenience, it is assumed that the beam is bent at the further upper stream side.

FIGS. 8A and 8B show an example of change in a beam profile on the limiting aperture according to the comparative example 1 to the first embodiment. FIG. 8A shows an example of a beam profile (A') which is not affected by electric field leakage, at the opening of the limiting aperture 206. On the other hand, if the influence of a leaked electric field occurs in the beam, since the beam deviates from the center of the opening of the limiting aperture 206 as shown in FIG. 8B, the tail portion of the beam profile (B') is blocked by the limiting aperture 206, so that the amount of current to pass therethrough changes.

Figure 9:
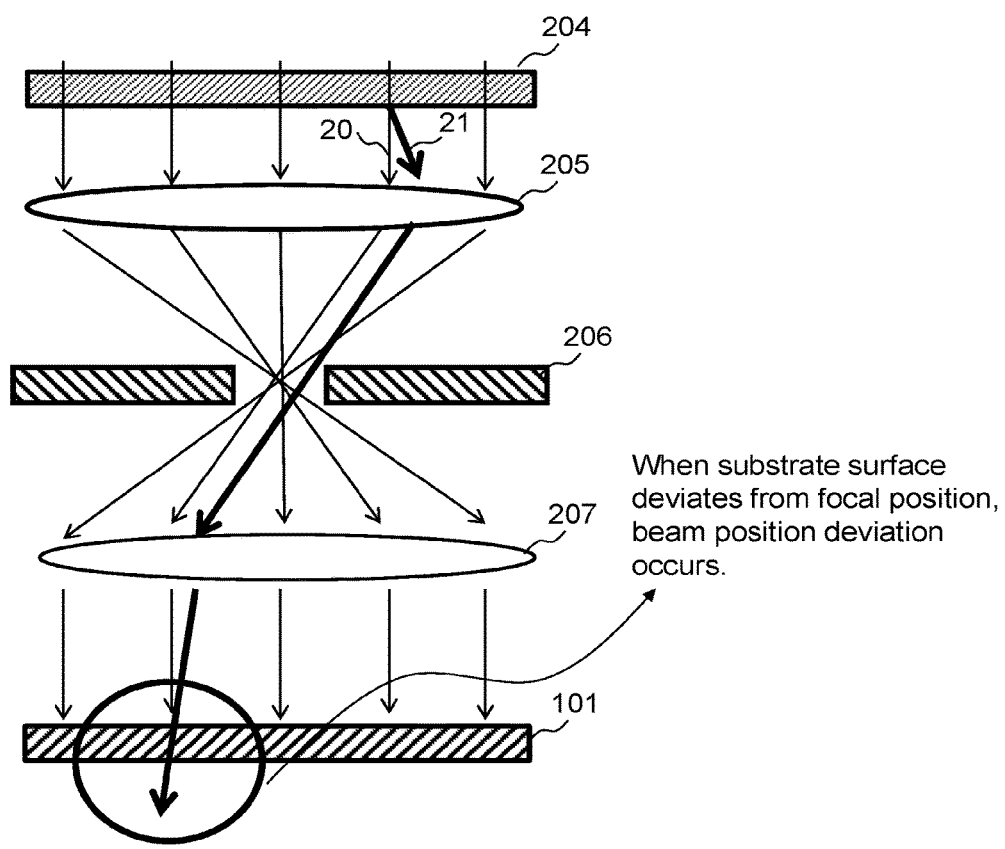
FIG. 9 illustrates deviation of an irradiation position on a target object surface according to the comparative example 1 to the first embodiment.

FIG. 9 illustrates deviation of an irradiation position on a target object surface according to the comparative example 1 to the first embodiment. If the beam trajectory is bent at the height position of the blanking aperture array mechanism 204 due to the influence of a leaked electric field, the incident angle to the surface of the target object 101 deviates. If the surface of the target object 101 deviates from the focal position of the multi-beams 20, the irradiation position deviates because of the beam whose trajectory has been bent.

Figure 10:
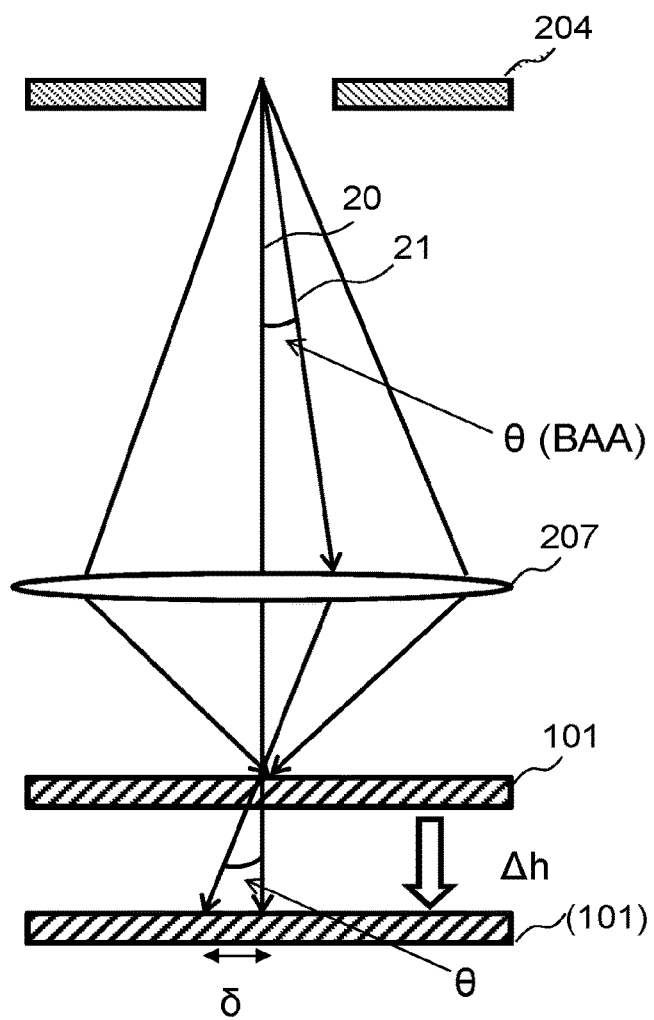
FIG. 10 is another figure illustrating deviation of an irradiation position on a target object surface according to the comparative example 1 to the first embodiment.

FIG. 10 is another figure illustrating deviation of an irradiation position on a target object surface according to the comparative example 1 to the first embodiment. If the beam trajectory is bent by angle θ at the height position of the blanking aperture array mechanism 204 due to the influence of a leaked electric field, the incident angle to the surface of the target object 101 deviates as shown in FIG. 10. If the surface of the target object 101 deviates downward by Δh from the focal position of the multi-beams 20, the irradiation position deviates by an error δ(=Δh·tan θ) from the design position.

Figure 11:
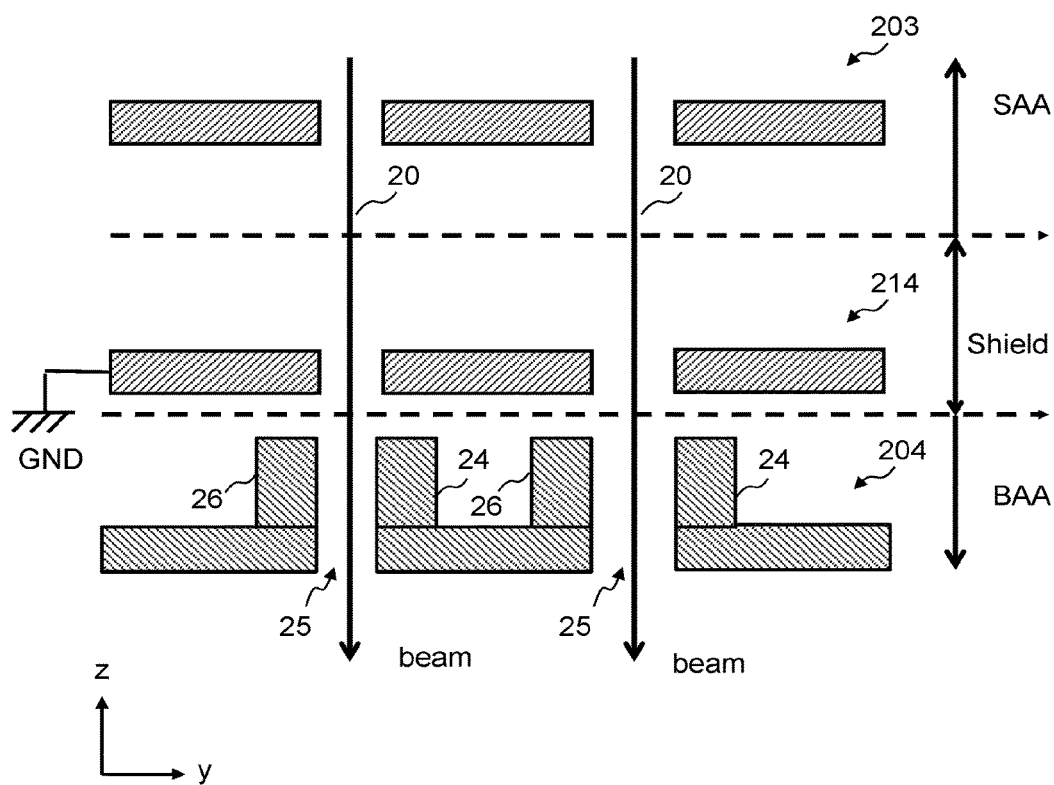
FIG. 11 is a sectional view showing a part of the structure of a shaping blanking aperture array mechanism according to the first embodiment.

FIG. 11 is a sectional view showing a part of the structure of a shaping blanking aperture array mechanism according to the first embodiment. In order to solve the problem described above, according to the first embodiment as shown in FIG. 11, the shield substrate 214 having been grounded is placed between the shaping aperture array substrate 203 (first substrate: SAA) and a plurality of control electrodes 24 formed on the substrate 31 of the blanking aperture array mechanism 204 (BAA). By this structure, even if there is the control electrode 24 to which, for example, a positive potential for blanking (for beam OFF control) has been applied, it is possible to block (or shield against) the leaked electric field E from the control electrode 24 by the shield substrate 214 before it spreads up to the trajectory of the beam adjacent to the beam concerned. Therefore, the bending of the beam trajectory due to the influence of the leaked electric field can be prevented or reduced.

Figure 12:
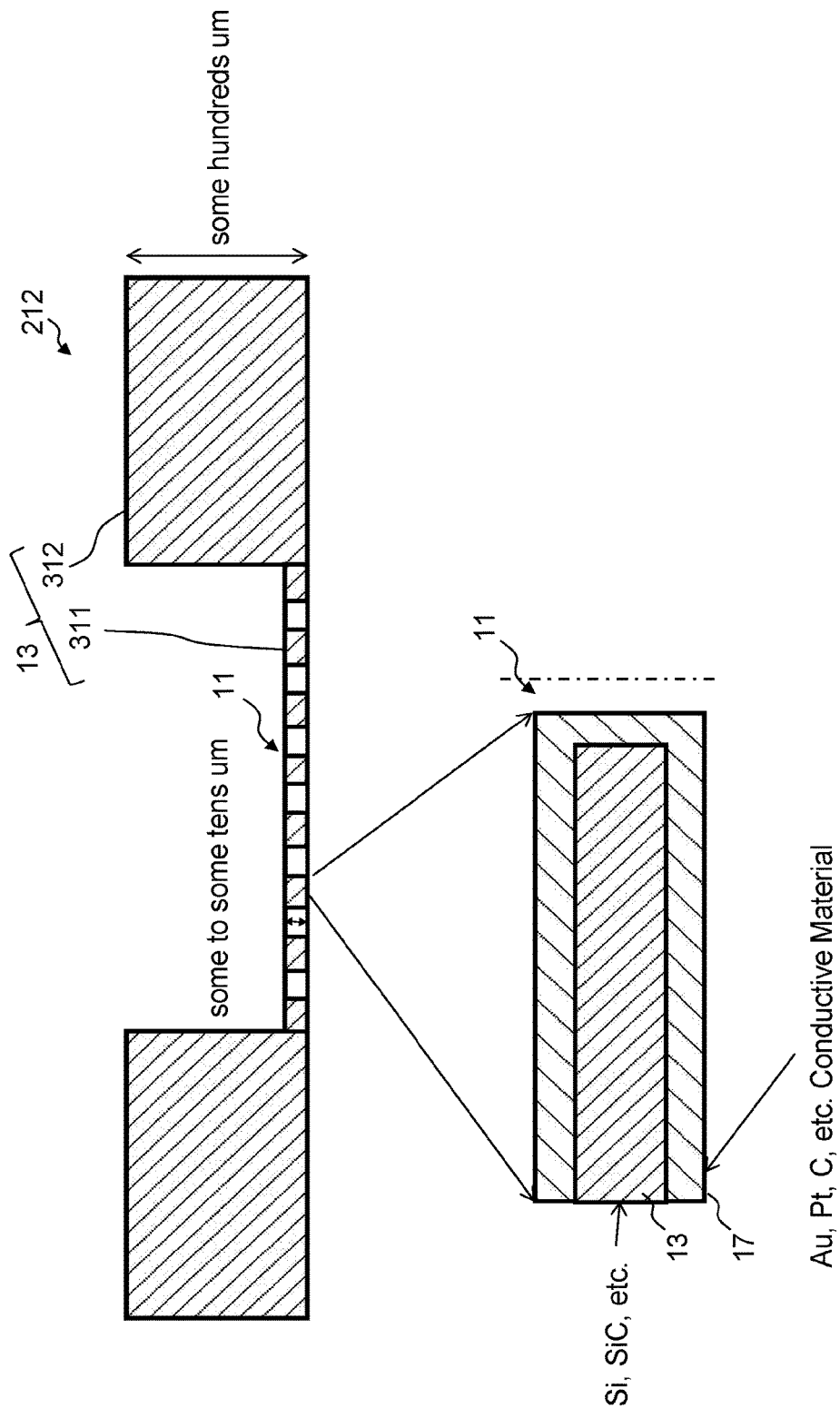
FIG. 12 shows an example of the structure of a shield substrate according to the first embodiment.

FIG. 12 shows an example of the structure of a shield substrate according to the first embodiment. As shown in FIG. 12, for example, silicon (Si) or silicon carbide (SiC) is preferably used as a material of the substrate 13 of the shield substrate 214. The central portion of the substrate 13 is thinly ground from the upper surface side, for example, and made into a membrane region 311 having a thin film. The circumference surrounding the membrane region 311 is a circumferential region 312 having a thick film H2. In the membrane region 311, there are formed a plurality of openings 11 each of which is positioned corresponding to at least each hole 22 in the shaping aperture array substrate 203 shown in FIG. 3A (or 3B) so as to enable a corresponding one of multi-beams to pass therethrough. In the membrane region 311 of the substrate 13, a shield film 17 has been applied to exposed surfaces, such as the upper surface, the rear surface, and the inner surface of the opening 11. It is preferable to use, for example, gold (Au), platinum (Pt), or carbon (C) as a material of the shield film 17. Thus, according to the first embodiment, the shield film 17 is provided between the shaping aperture array substrate 203 (first substrate) and a plurality of control electrodes 24 on the substrate 31 of the blanking aperture array mechanism 204 (BAA).

FIGS. 13A to FIG. 13D are sectional views showing combination examples of structures of a shaping blanking aperture array mechanism according to the first embodiment. In FIG. 13A, as described above, the shaping aperture array substrate 203 (first substrate: SAA), the shield substrate 214, and the blanking aperture array mechanism 204 (BAA) are formed separately from each other as separated bodies, and there is no contact between the substrates or between the substrate and the control electrode 24. The structure of the shaping blanking aperture array mechanism 212 is not limited to this structure. It is also preferable, as shown in FIG. 13B, that the shield substrate 214 and the counter electrode 26 on the substrate 31 of the blanking aperture array mechanism 204 (BAA) are connected with each other below the shaping aperture array substrate 203 (first substrate: SAA), and the shield substrate 214 and the blanking aperture array mechanism 204 (BAA) are integrally formed as one piece. Alternatively, as shown in FIG. 13C, it is also preferable that a shield film is formed above the blanking aperture array mechanism 204 (BAA) and at least on the rear surface side of the shaping aperture array substrate 203 (first substrate: SAA), and the shaping aperture array substrate 203 (first substrate: SAA) and the shield substrate 214 are integrally formed as one piece. Alternatively, as shown in FIG. 13D, it is also preferable that a shield film is formed at least on the rear surface side of the shaping aperture array substrate 203 (first substrate: SAA), the rear surface of the shaping aperture array substrate 203 and the counter electrode 26 on the substrate 31 of the blanking aperture array mechanism 204 (BAA) are connected with each other, and the shaping aperture array substrate 203 (first substrate: SAA), the shield substrate 214, and the blanking aperture array mechanism 204 (BAA) are integrally formed as one piece. In the structures of FIGS. 13B and 13D in which the shield substrate 214 and the counter electrode 26 are connected with each other, the height of the control electrode 24 is made lower than that of the counter electrode 26. By this structure, short circuit between the control electrode 24 and the counter electrode 26 (and the shield substrate 214) can be prevented.

As shown in FIG. 13C, in the case where the shaping aperture array substrate 203 (first substrate: SAA) and the shield substrate 214 are integrally formed as one piece, the shield film 17 described above should be formed on the exposed surface of the shaping aperture array substrate 203 by a sputtering method, plating method, chemical vapor deposition (CVD) method, or the like, for example. As shown in FIGS. 13B and 13D, in the case where the shield substrate 214 and the blanking aperture array mechanism 204 (BAA) are integrally formed as one piece, a sacrificial film (not shown) should be formed on the substrate 31 on which the control electrode 24 and the counter electrode 26 are formed. Thereby, the space between the control electrode 24 and the counter electrode 26 is filled with the sacrificial film. Then, after planarizing up to the height position of the counter electrode 26 by a chemical mechanical polishing (CMP) method, etc., the shield film 17 described above is formed by a sputtering method, plating method, CVD method, or the like, for example. Then, after forming the opening 11 in the shield film 17 by a lithography technique, the sacrificial film should be removed by an etching method, etc. In such a case, for example, silicon oxide ($SiO_2$) can be used as the sacrificial film, and hydrofluoric acid (HF) can be used as the etching solution. Alternatively, for example, carbon (C) can be used as the sacrificial film, and this film may be removed by asking.

Figure 14A:
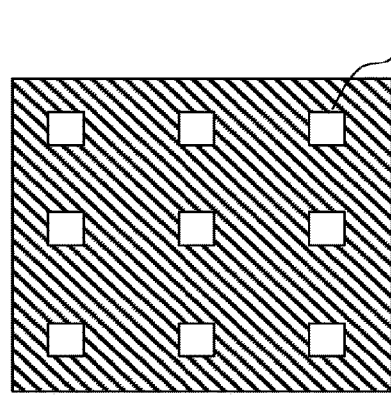
FIGS. 14A to FIG. 14D show shape examples of an opening of a shield substrate according to the first embodiment.
Figure 14B:
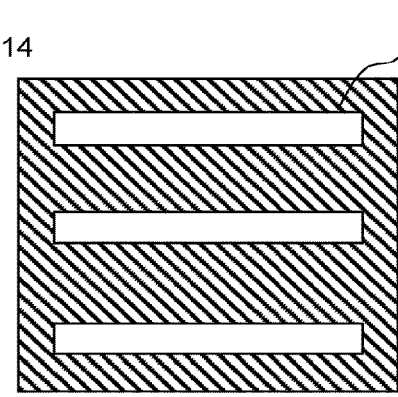
Figure 14C:
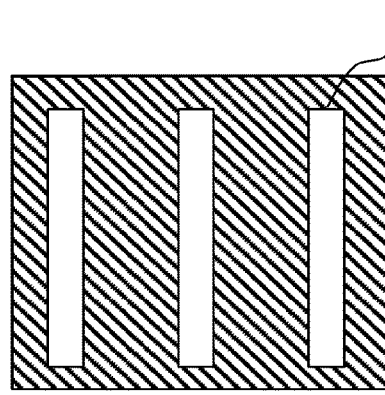
Figure 14D:
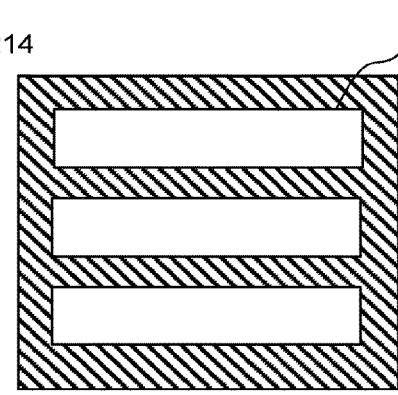

FIGS. 14A to FIG. 14D show shape examples of an opening of a shield substrate according to the first embodiment. FIG. 14A shows the case where, in the shield substrate 214 (shield film 17), a plurality of rectangular openings 11 (third opening) are formed to be corresponding to a plurality of passage holes 25 (second opening) formed in the substrate 31 of the blanking aperture array mechanism 204 (BAA). FIGS. 14B to 14D show the case where a plurality of openings 11 (third opening) in the shape of line and space patterns are formed in the shield substrate 214 (shield film 17). Since the multi-beams 20 cannot pass through a plurality of passage holes 25 unless regions in the shield substrate 214 above the holes 25 are open, it is preferable that a plurality of openings 11 in the shape of line and space patterns are formed along one of the row direction and the column direction of a plurality of passage holes 25 formed in an array in the substrate 31 of the blanking aperture array mechanism 204 (BAA). FIG. 14B shows the case where a plurality of openings 11 each extending in the x direction are formed. FIG. 14C shows the case where a plurality of openings 11 each extending in the y direction are formed. FIG. 14D shows the case where a plurality of openings 11 each extending in the x direction and being wider than that of FIG. B. Although not shown, a plurality of openings 11 may be formed so as to extend in an oblique direction such that each of the plurality of openings 11 is open above a corresponding diagonal row of a plurality of passage holes 25 formed in an array in the x and y directions.

Figure 15:
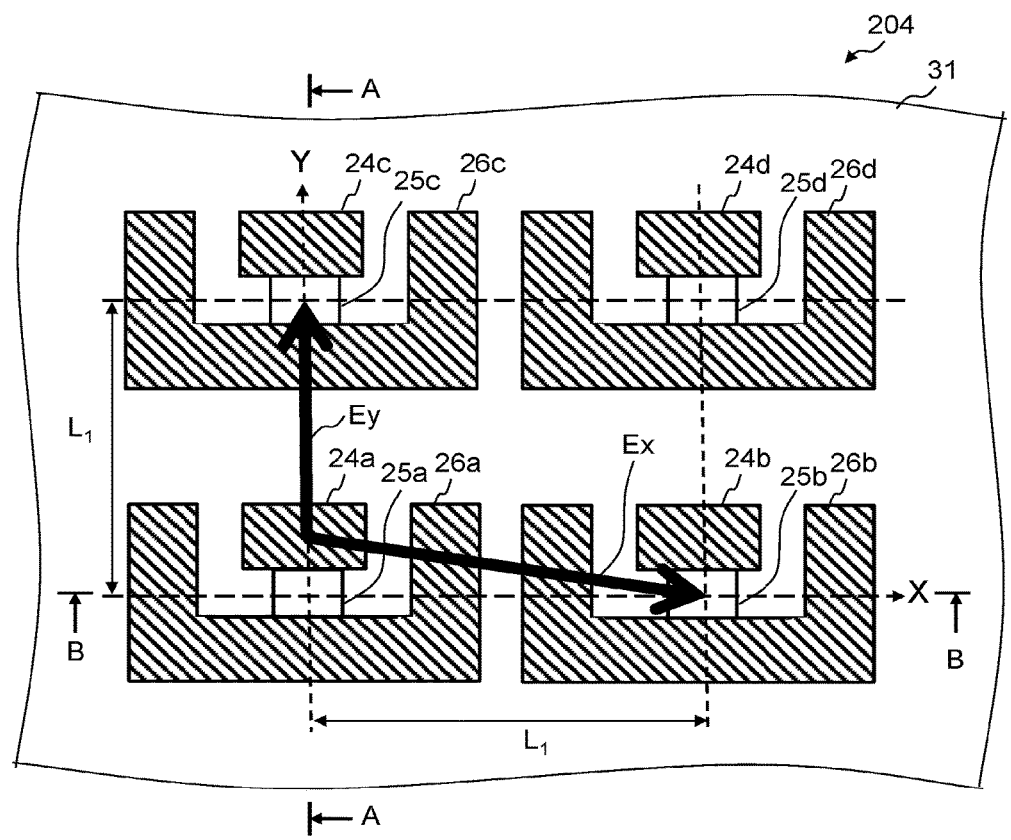
FIG. 15 is a top view showing examples of arrangement structures of a control electrode and a counter electrode according to the first embodiment.

FIG. 15 is a top view showing examples of arrangement structures of a control electrode and a counter electrode according to the first embodiment. FIG. 15 shows the case where the control electrode 24 and the counter electrode 26 are arranged in the y direction across the corresponding passage hole 25. Not only facing the control electrode 24 across the passage hole 25, the counter electrode 26 should preferably be formed in a "U" shape so as to extend on both the sides of the passage hole 25 with respect to the facing direction (y direction). In this arrangement structure, each of a plurality of control electrodes 24 is arranged so as not to be directly exposed to another passage hole 25 adjacent to the corresponding passage hole 25 concerned. Here, in the example of FIG. 15, when a positive electric potential is applied only to the control electrode 24 of the individual blanking mechanism at the lower left side in the four individual blanking mechanisms, a leaked electric field Ey acts on the trajectory (position of the passage hole 25*c*) of the beam adjacent in the y direction. On the other hand, a leaked electric field Ex acts on the trajectory (position of the passage hole 25*b*) of the beam adjacent in the x direction.

Figure 16:
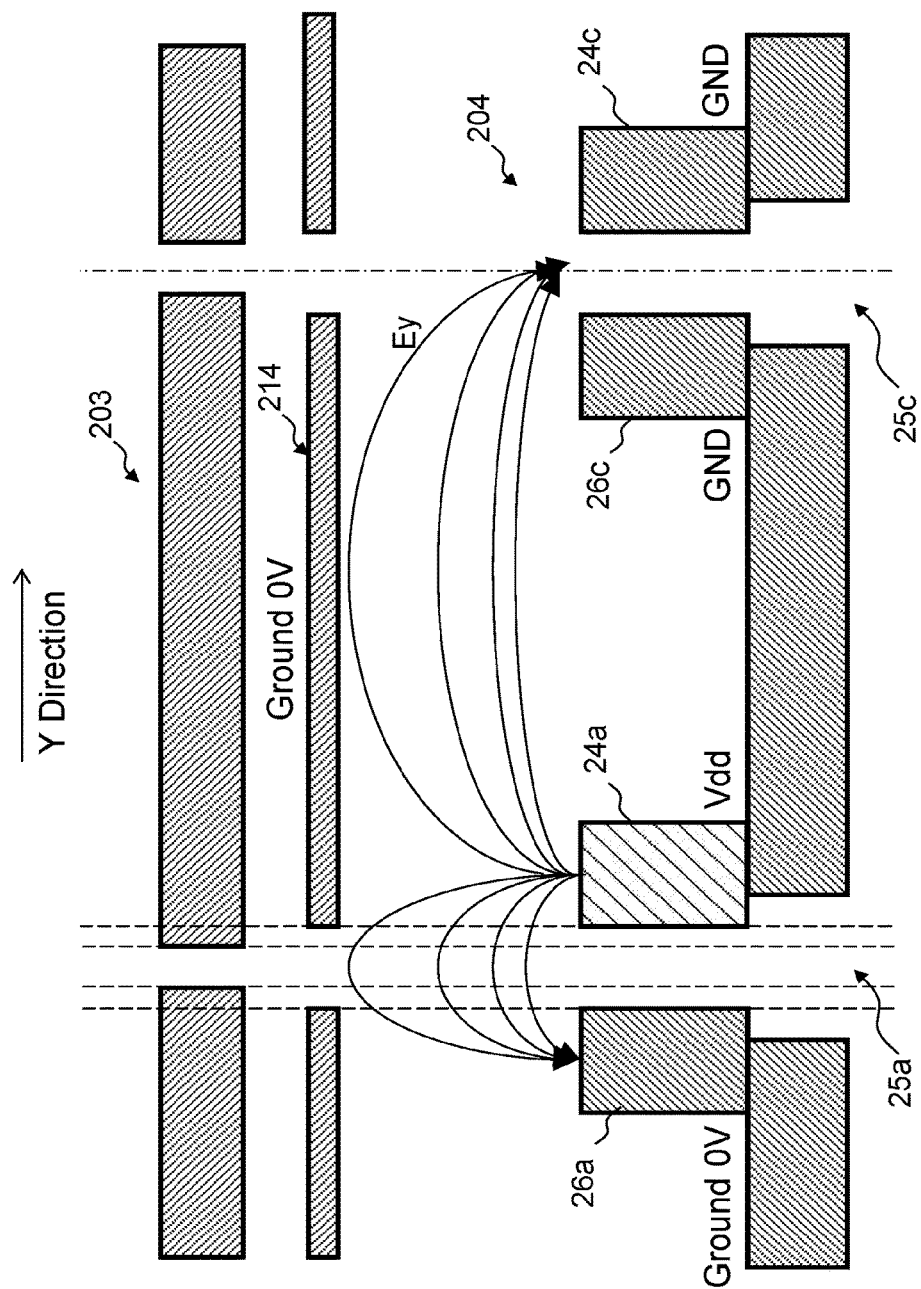
FIG. 16 shows an example of a sectional view of a shaping blanking aperture array mechanism according to the first embodiment.

FIG. 16 shows an example of a sectional view of a shaping blanking aperture array mechanism according to the first embodiment. FIG. 16 is a section at AA in FIG. 15, in the state where the arrangement height position of the shield substrate 214 is separated from the control electrode 24.

Figure 17:
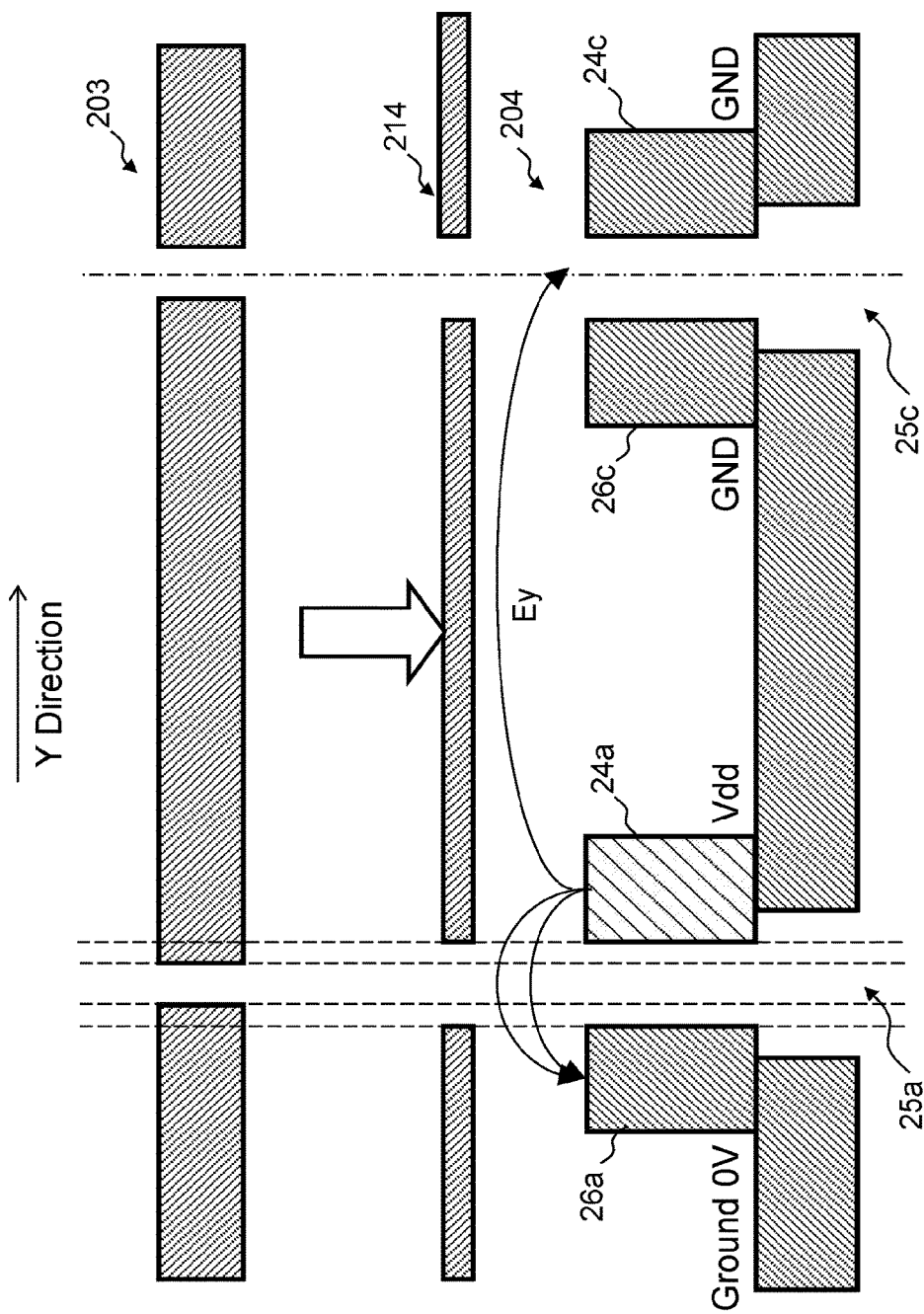
FIG. 17 shows another example of a sectional view of the shaping blanking aperture array mechanism according to the first embodiment.

FIG. 17 shows another example of a sectional view of the shaping blanking aperture array mechanism according to the first embodiment. FIG. 17 is a section at AA in FIG. 15, in the state where the arrangement height position of the shield substrate 214 is closer to the control electrode 24 than that of FIG. 16. When a positive electric potential is applied only to the control electrode 24*a*, the leaked electric field Ey acts on the trajectory (position of the passage hole 25*c*) of the beam adjacent in the y direction. Here, as shown in FIGS. 16 and 17, if the arrangement height position of the shield substrate 214 becomes closer to the control electrode 24, the number of lines of electric force of the leaked electric field Ey can be reduced, so that the influence of the leaked electric field Ey on the trajectory (position of the passage hole 25*c*) of the adjacent beam can be inhibited.

Figure 18:
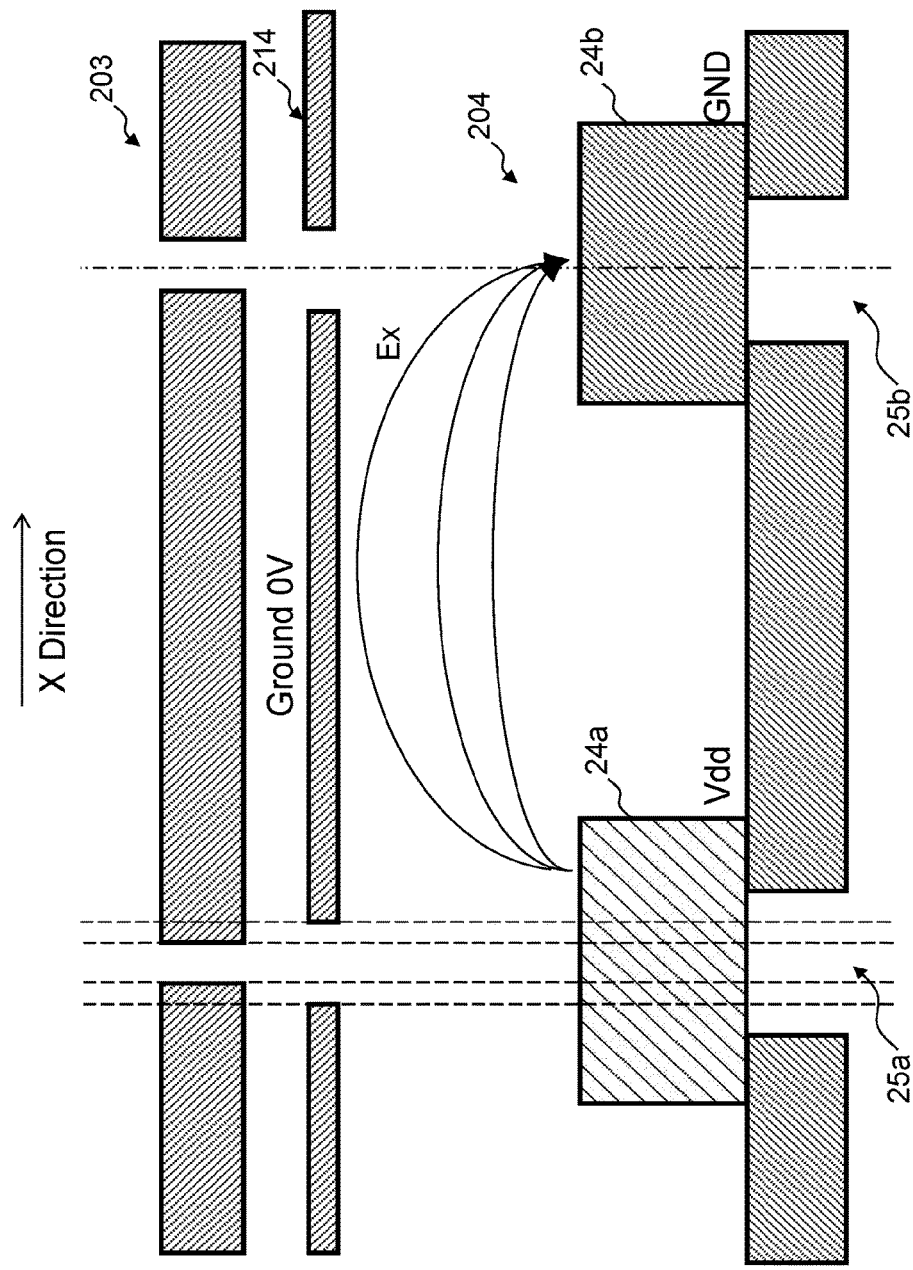
FIG. 18 shows another example of a sectional view of the shaping blanking aperture array mechanism according to the first embodiment.

FIG. 18 shows another example of a sectional view of the shaping blanking aperture array mechanism according to the first embodiment. FIG. 18 is a section at BB in FIG. 15, in the state where the arrangement height position of the shield substrate 214 is separated from the control electrode 24.

Figure 19:
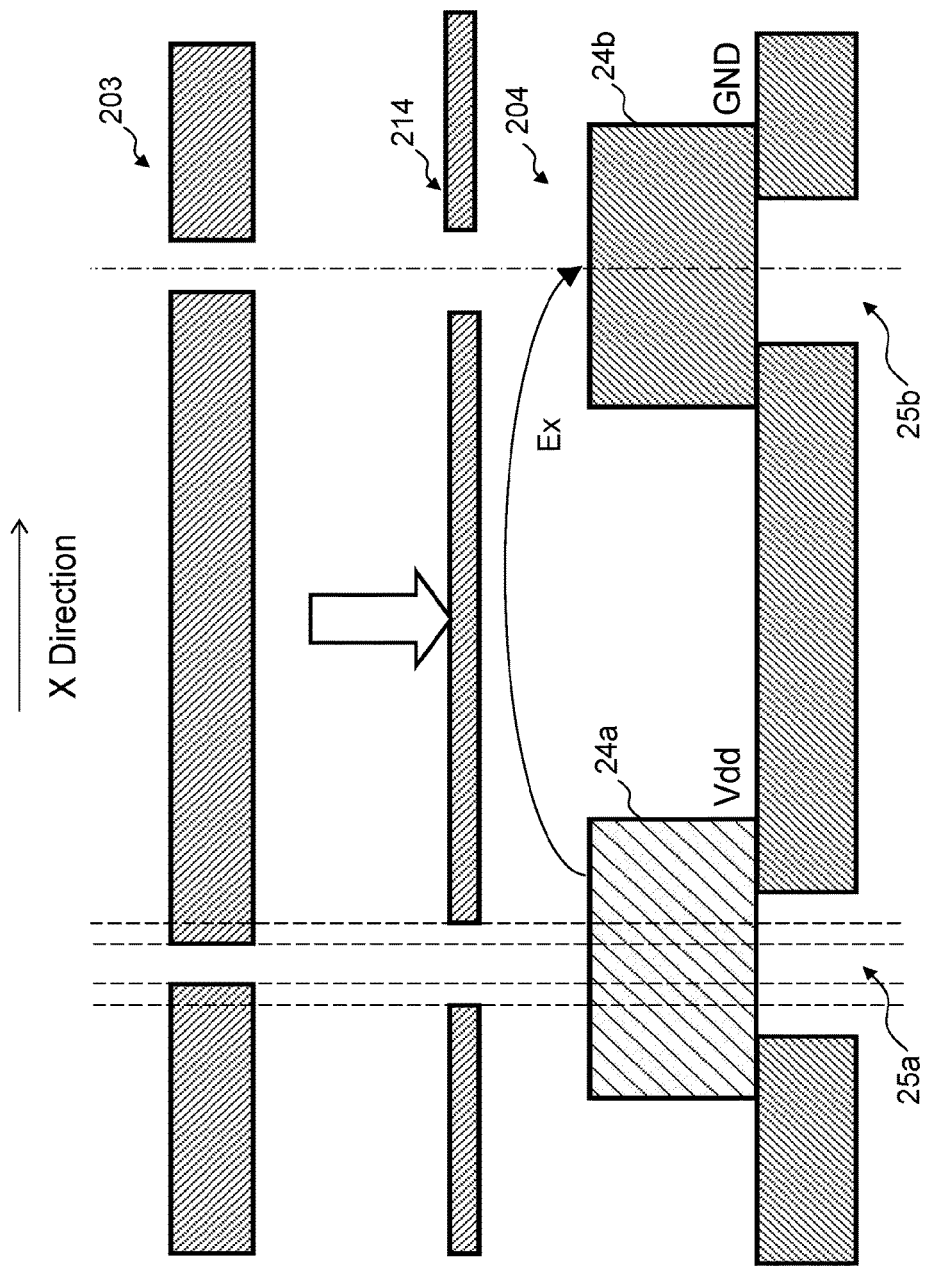
FIG. 19 shows another example of a sectional view of the shaping blanking aperture array mechanism according to the first embodiment.

FIG. 19 shows another example of a sectional view of the shaping blanking aperture array mechanism according to the first embodiment. FIG. 19 is a section at BB in FIG. 15, in the state where the arrangement height position of the shield substrate 214 is closer to the control electrode 24 than that of FIG. 18. In FIGS. 18 and 19, the counter electrode 26 is omitted. When a positive electric potential is applied only to the control electrode 24*a*, the leaked electric field Ex acts on the trajectory (position of the passage hole 25*b*) of the beam adjacent in the x direction. Here, as shown in FIGS. 18 and 19, if the arrangement height position of the shield substrate 214 becomes closer to the control electrode 24, the number of lines of electric force of the leaked electric field Ex can be reduced, so that the influence of the leaked electric field Ex on the trajectory (position of the passage hole 25*b*) of the adjacent beam can be inhibited.

Figure 20A:
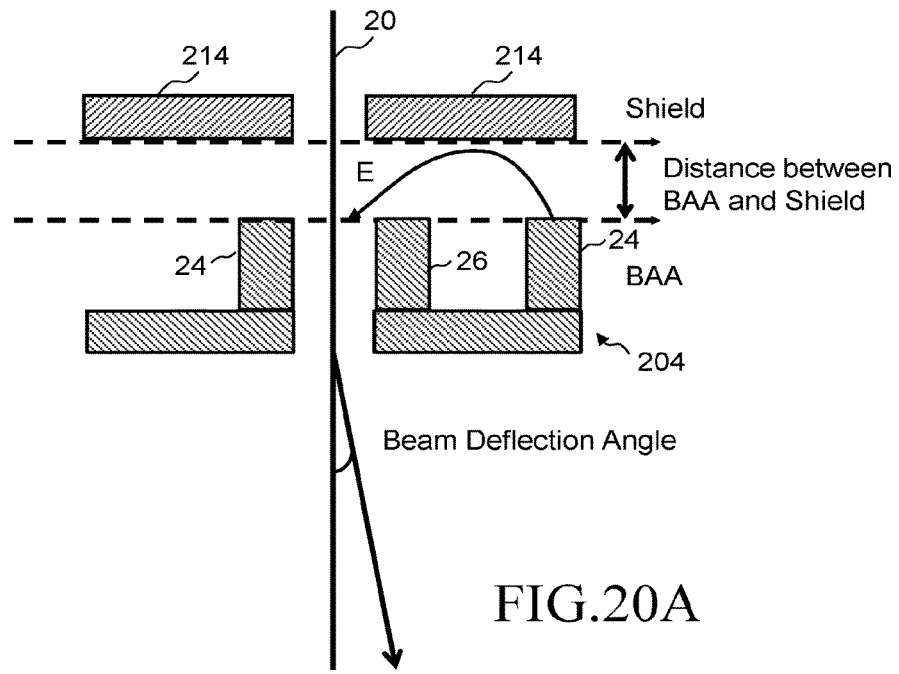
FIGS. 20A and 20B show an example of an effect relating to the distance between a shield substrate and a control electrode according to the first embodiment.
Figure 20B:
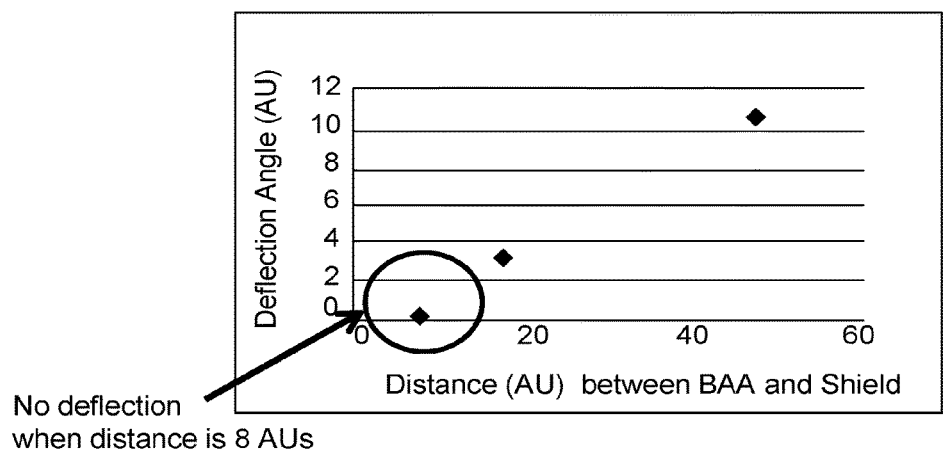

FIGS. 20A and 20B show an example of an effect relating to the distance between a shield substrate and a control electrode according to the first embodiment. As shown in FIG. 20A, when the distance between the shield substrate 214 and the control electrode 24 is made variable, the deflection angle of an adjacent beam changes. The value of the deflection angle varies depending on conditions such as an acceleration voltage for emitting the multi-beams 20, etc. FIG. 20B shows an example of a simulation result relating to the deflection angle of an adjacent beam in the case where the distance between the shield substrate 214 and the control electrode 24 is made variable. Each of the unit of the distance between the shield substrate 214 and the control electrode 24, and the unit of the deflection angle of a beam is shown as an arbitrary unit (AU). In spite of being an arbitrary unit, its tendency is similar to that of an actual unit. As shown in FIG. 20B, the shorter the distance between the shield substrate 214 and the control electrode 24 is, the less the beam deflection angle becomes. Therefore, it is preferable that the distance between the shield substrate 214 and the control electrode 24 is as short as possible. For example, in the case of FIG. 20B, the deflection angle of the beam is substantially zero when the distance is 8 AUs. In other words, even when the distance between the shield substrate 214 and the control electrode 24 is not zero, the beam deflection angle can be made substantially zero.

Figure 21:
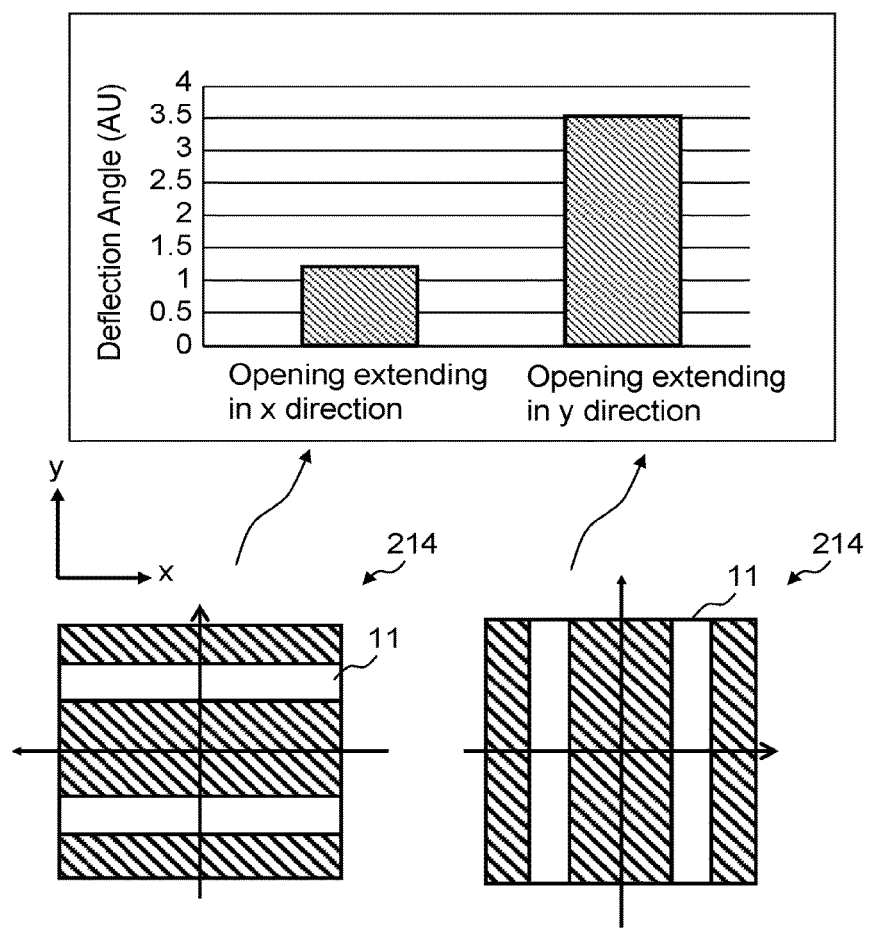
FIG. 21 shows an example of an effect relating to the direction of the opening of a shield substrate according to the first embodiment.

FIG. 21 shows an example of an effect relating to the direction (orientation) of the opening of a shield substrate according to the first embodiment. As shown in FIG. 21, a plurality of openings 11 in the shape of line and space patterns may be formed in the shield substrate 214. In such a case, when the arrangement structure of the passage hole 25, the control electrode 24, and the counter electrode 26 is as shown in FIG. 15, the deflection angle of an adjacent beam changes depending on the longitudinal direction of a plurality of openings 11 in the shape of line and space patterns as shown in FIG. 21. When the distance between the adjacent passage holes 25 is always L1, the distance from the control electrode 24*a* which generates an electric field to the trajectory (position of the passage hole 25*c*) of a beam adjacent in the y direction is shorter than that to the trajectory (position of the passage hole 25*b*) of a beam adjacent in the x direction as shown in FIG. 15. Therefore, the influence of the leaked electric field E generated from the control electrode 24*a* is intrinsically stronger on the trajectory (position of the passage hole 25*c*) of a beam adjacent in they direction whose distance is shorter. In addition to this, if the opening 11 is formed so as to extend in the y direction to make the distance shorter, the field above the straight line connecting between the control electrode 24*a* and the trajectory (position of the passage hole 25*c*) of the beam adjacent in the y direction is in the state not being shielded because of the opening 11. On the other hand, if the opening 11 is formed so as to extend in the x direction, the state will be described below.

Figure 22:
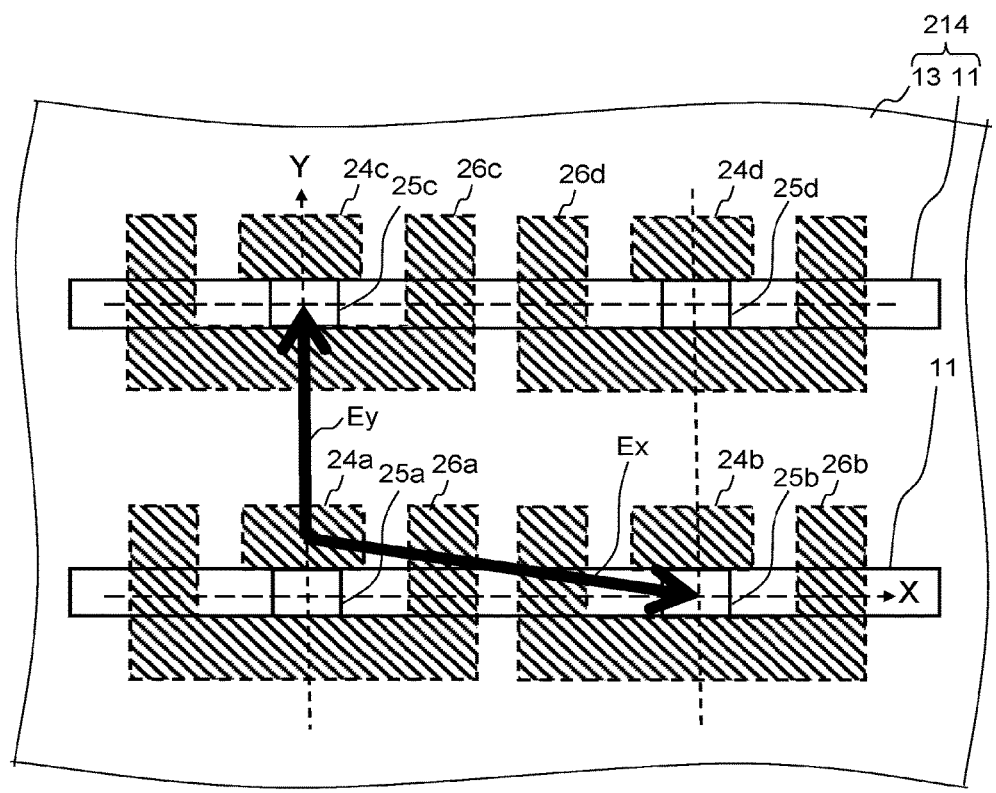
FIG. 22 shows an example of a top view of a shield substrate in the case where the opening portion of the shield substrate extends in the x direction according to the first embodiment.

FIG. 22 shows an example of a top view of a shield substrate in the case where the opening portion of the shield substrate extends in the x direction according to the first embodiment. When the opening 11 is formed so as to extend in the x direction, the straight line between the control electrode 24*a* and the trajectory (position of the passage hole 25*c*) of a beam adjacent in the x direction is not parallel to the opening 11 but having an angle to it. Therefore, although a part of the field above the straight line connecting between the control electrode 24*a* and the trajectory (position of the passage hole 25*c*) of the beam adjacent in the x direction is in the state not being shielded because of the opening 11, but the other part is shielded. In particular, the field above the control electrode 24a which generates a leaked electric field can be shielded. It is desirable to completely cover the field above the control electrode 24a. However, even when the field above the control electrode 24a is not completely covered, a great effect can be obtained by covering at least a large part of the field above the control electrode 24. Furthermore, the field above the straight line connecting between the control electrode 24a and the trajectory (position of the passage hole 25c) of a beam adjacent in the y direction can be shielded. Therefore, when a plurality of openings 11 in the shield substrate 214 are formed in the shape of line and space patterns, as shown in FIG. 21, the influence of a leaked electric field can be more suppressed in the case of forming the openings 11 so as to extend in the x direction than forming them so as to extend in the y direction. In other words, it is preferable, with respect to the row direction and the column direction of a plurality of passage holes 25 (second opening) formed in an array, if a plurality of openings 11 (third opening) in the shield substrate 214 are formed so as to extend in the direction for reducing exposure of a plurality of control electrodes 24.

Figure 23:
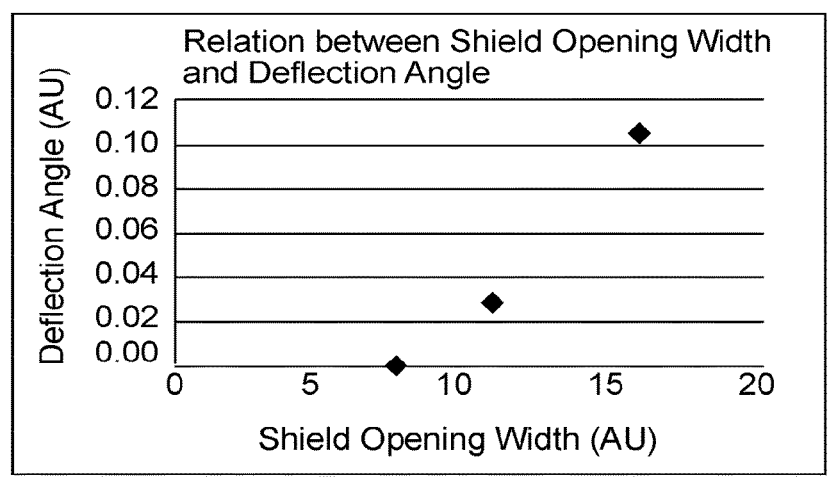
FIG. 23 shows an example of an effect relating to the opening width of a shield substrate according to the first embodiment.

FIG. 23 shows an example of an effect relating to the opening width of a shield substrate according to the first embodiment. FIG. 23 shows an example of a simulation result relating to the deflection angle of an adjacent beam when the width of a plurality of openings 11 is made variable in the case where a plurality of openings 11 in the shape of line and space patterns are formed in the shield substrate 214. Each of the unit of the width of the opening 11 and the unit of the deflection angle of a beam is shown as an arbitrary unit (AU). In spite of being an arbitrary unit, its tendency is similar to that of an actual unit. As shown in FIG. 23, the shorter the width of each of a plurality of openings 11 is, the less the beam deflection angle becomes. Therefore, it is preferable to make the width of the opening 11 as short as possible, to some extent not to block each beam to pass. For example, in the case of FIG. 23, the deflection angle of the beam is substantially zero when the width is 8 AUs. In other words, even when the width of the opening 11 is not zero, the beam deflection angle can be made substantially zero. It has turned out from the simulation result that the width of the opening 11 based on which the beam deflection angle is substantially zero can be sufficiently wider than the width of the hole 22 for forming beams. That is, the widths of the hole 22 of the shaping aperture array substrate 203, the opening 11 of the shield substrate 214, and the passage hole 25 of the blanking aperture array mechanism can be increased in this order. Alternatively, the widths of the hole 22 of the shaping aperture array substrate 203, the passage hole 25 of the blanking aperture array mechanism, and the opening 11 of the shield substrate 214 can be increased in this order. Therefore, it is possible to suppress the deflection angle of a beam due to the influence of electric field leakage to be substantially zero by using the width which does not interfere with a formed beam.

Figure 24A:
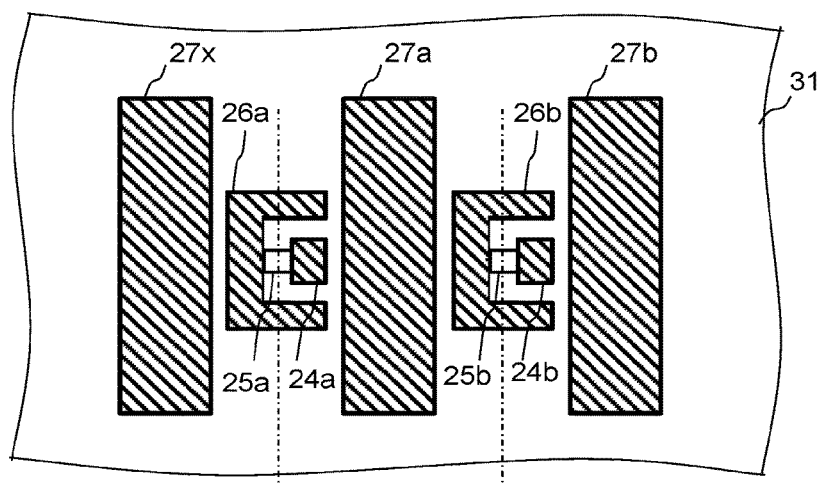
FIGS. 24A and 24B show an example of an influence of electric field leakage according to a comparative example 2 to the first embodiment.
Figure 24B:
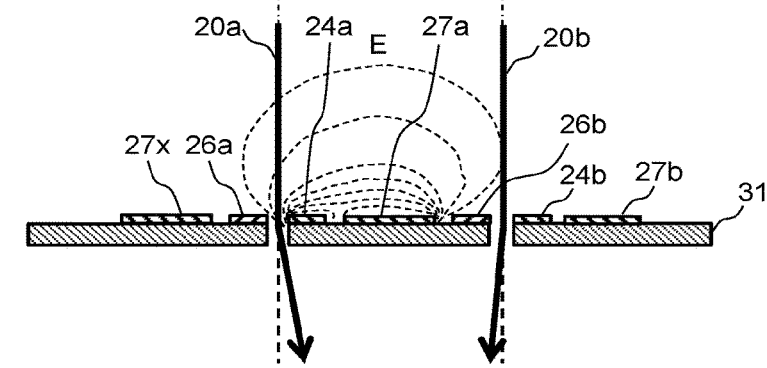

FIGS. 24A and 24B show an example of an influence of electric field leakage according to a comparative example 2 to the first embodiment. In the comparative example 2, a wiring 27 connected to the control electrode 24 is formed and exposed on the upper surface of the substrate. When a positive potential is applied to the control electrode 24a, the positive potential is generated also in a wiring 27a connected to the control electrode 24a. Therefore, as shown in FIGS. 24A and 24B, the leaked electric field E is generated not only from the control electrode 24a but also from the wiring 27a. Thus, here, the distance from the source of the leaked electric field E to the trajectory (passage hole 25b) of an adjacent beam is very short. Accordingly, even if the shield substrate 214 is arranged on the control electrode 24 and the wiring 27, it is difficult to sufficiently eliminate the influence of the leaked electric field E on the trajectory (passage hole 25b) of the adjacent beam. By contrast, according to the first embodiment, a plurality of control circuits 41, each of which switchably applies a positive potential and a ground potential to a corresponding control electrode 24 in a plurality of control electrodes 24, are formed in the substrate 31 of the blanking aperture array mechanism 204 (BAA). Therefore, the wiring connected to the control electrode 24 is not exposed. Thus, spreading of a leaked electric field, such as the case of the comparative example 2, can be prevented, and the influence of the leaked electric field E on the trajectory (passage hole 25b) of an adjacent beam can be thoroughly eliminated.

Figure 25A:
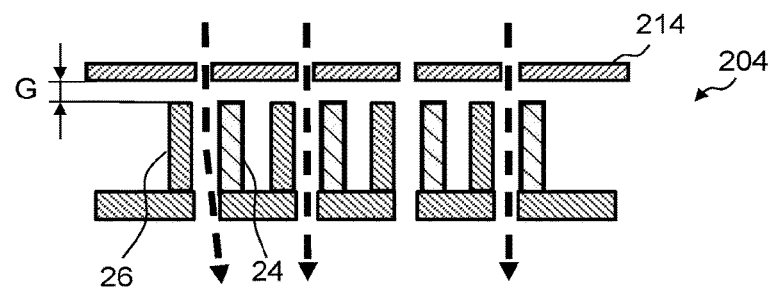
FIGS. 25A to 25C each shows an example of modification of a shield substrate and a blanking aperture array mechanism according to the first embodiment.
Figure 25B:
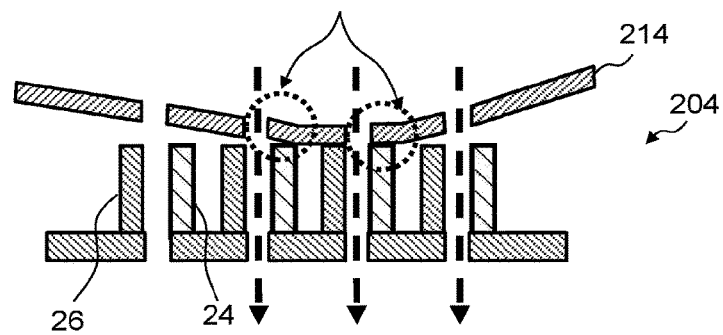
Figure 25C:
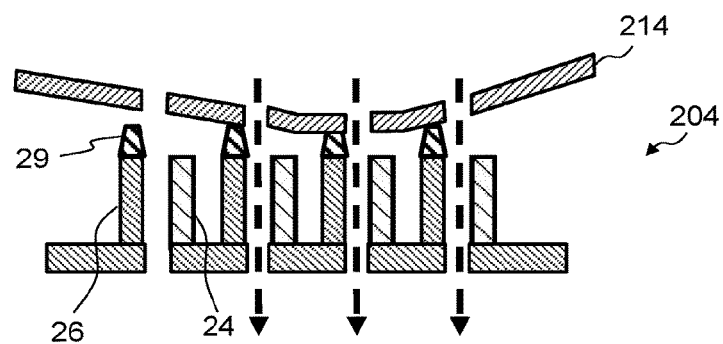

FIGS. 25A to 25C each shows an example of modification of a shield substrate and a blanking aperture array mechanism according to the first embodiment. In the above examples, it is described that a crevice (opening) G is formed between the shield substrate 214 and the control electrode 24 of the blanking aperture array mechanism 204. As shown in FIG. 25A, when the control electrode 24 and the counter electrode 26 are formed to have the same height, if the shield substrate 214 sags under its own weight, etc., the control electrode 24 and the shield substrate 214 may be short-circuited as shown in FIG. 25B. Then, according to modification of the first embodiment, a stopper film 29 is formed on the counter electrode 26. By this structure, even when the shield substrate 214 sags under its own weight, etc., the stopper film 29 abuts and supports the shield substrate 214 as shown in FIG. 25C. Therefore, it is possible to prevent the shield substrate 214 from sagging any more, and to prevent the short-circuit between the control electrode 24 and the shield substrate 214. The stopper film 29 may be either a conductive film or an insulating film.

As described above, according to the first embodiment, the influence of electric field leakage from the control electrode 24 or the like for blanking an adjacent beam in multi-beam writing can be suppressed.

Embodiments have been explained referring to concrete examples described above. However, the present invention is not limited to these specific examples. While the case of inputting a 10-bit control signal into the control circuit 41 has been described above, the number of bits may be suitably set. For example, a 2-bit (or 3 to 9 bit) control signal may be used. Alternatively, a control signal of 11 bits or more may be used.

While the apparatus structure, control method, and the like not directly necessary for explaining the present invention are not described, some or all of them can be selectively used case-by-case basis. For example, although description of the structure of the control unit for controlling the writing apparatus 100 is omitted, it should be understood that some or all of the structure of the control unit can be selected and used appropriately when necessary.

In addition, any other blanking device, and multi charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blanking device for multi charged particle beams comprising:
    a first substrate, in which a plurality of first openings are formed in an array, configured to form multi-beams by making a region including the plurality of first openings irradiated by a charged particle beam, and making portions of the charged particle beam individually pass through a corresponding one of the plurality of first openings;
    a second substrate in which a plurality of second openings are formed in an array, where a corresponding beam of the multi-beams passes through each of the plurality of second openings;
    a plurality of control electrodes, which are on the second substrate and each of which is arranged close to a corresponding one of the plurality of second openings and arranged so as not to be directly exposed to other second opening adjacent to the corresponding one of the plurality of second openings, configured to be switchably applied with a first potential and a second potential;
    a plurality of counter electrodes, which are on the second substrate and each of which is arranged to be facing a corresponding one of the plurality of control electrodes across a corresponding one of the plurality of second openings, configured to be applied with the second potential;
    a grounded shield film, provided between the first substrate and the second substrate, configured to shield against an electric field, while making pass through the multibeams without shaping the corresponding beam of the multi-beams; and
    a plurality of control circuits, arranged in the second substrate, configured to switchably apply the first potential and the second potential to a corresponding one of the plurality of control electrodes.

2. The device according to claim 1, wherein a plurality of third openings each being rectangular are formed in the shield film, to be corresponding to the plurality of second openings.

3. The device according to claim 1, wherein a plurality of third openings in a shape of line and space patterns are formed in the shield film.

4. The device according to claim 3, wherein the plurality of third openings are formed so as to extend in one of a row direction and a column direction of the plurality of second openings formed in an array such that exposure of the plurality of control electrodes is reduced.

5. The device according to claim 1, wherein any one of the plurality of counter electrodes is arranged between the one of the plurality of control electrodes arranged close to the corresponding one of the plurality of second openings and the other second opening adjacent to the corresponding one of the plurality of second openings.

6. The device according to claim 1, wherein, while an above the plurality of second openings is open, the shield film covers at least a large part above the plurality of control electrodes.

7. The device according to claim 1, further comprising:
    a third substrate, on whose surface the shield film is formed, between the first substrate and the second substrate.

8. The device according to claim 1, wherein the shield fihn is arranged to contact with the plurality of control electrodes.

9. The device according to claim 1, wherein the shield film is formed on a rear surface of the first substrate.

10. A multi charged particle beam irradiation apparatus comprising:
    a stage configured to mount a target object thereon and to be continuously movable;
    an emission source configured to emit a charged particle beam;
    a blanking device for multi charged particle beams of claim 1, configured to form multi-beams by using the charged particle beam, and provide blanking deflection of a corresponding one of the multi-beams; and
    a limiting aperture substrate configured to block each beam deflected to be in a beam OFF condition by the blanking device.

* * * * *